United States Patent
Maejima

(10) Patent No.: US 8,270,218 B2
(45) Date of Patent: Sep. 18, 2012

(54) SEMICONDUCTOR MEMORY DEVICE COMPRISING MEMORY CELL HAVING CHARGE ACCUMULATION LAYER AND CONTROL GATE AND METHOD OF ERASING DATA THEREOF

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 689 days.

(21) Appl. No.: 12/406,503

(22) Filed: Mar. 18, 2009

(65) Prior Publication Data
US 2009/0244969 A1    Oct. 1, 2009

(30) Foreign Application Priority Data
Mar. 24, 2008  (JP) ................................. 2008-076578

(51) Int. Cl.
*G11C 11/34* (2006.01)
*G11C 16/04* (2006.01)

(52) U.S. Cl. ......... 365/185.18; 365/185.03; 365/185.05; 365/185.11; 365/185.21; 365/185.29

(58) Field of Classification Search ............. 365/185.03, 365/185.05, 185.11, 185.18, 185.21, 185.29
See application file for complete search history.

(56) References Cited

U.S. PATENT DOCUMENTS

| | | | | |
|---|---|---|---|---|
| 7,551,492 B2 * | 6/2009 | Kim | ...................... | 365/185.29 |
| 7,660,157 B2 * | 2/2010 | Maejima et al. | ......... | 365/185.17 |
| 2008/0013382 A1 * | 1/2008 | Tang | ...................... | 365/185.24 |
| 2008/0054991 A1 | 3/2008 | Maejima | | |
| 2008/0094903 A1 | 4/2008 | Maejima et al. | | |

FOREIGN PATENT DOCUMENTS

| | | |
|---|---|---|
| JP | 11-250681 | 9/1999 |
| JP | 2001-250390 | 9/2001 |
| JP | 2006-172630 | 6/2006 |
| JP | 2007-172769 | 7/2007 |
| JP | 2007-305204 | 11/2007 |
| JP | 2008-10076 | 1/2008 |
| JP | 2010-507181 | 3/2010 |
| WO | WO 2006/105133 A1 | 10/2006 |
| WO | WO 2008/011440 A2 | 1/2008 |

OTHER PUBLICATIONS

Office Action issued Oct. 26, 2010, in Japan Patent Application No. 2008-076578 (with English translation).

* cited by examiner

*Primary Examiner* — Toan Le
(74) *Attorney, Agent, or Firm* — Oblon, Spivak, McClelland, Maier & Neustadt, L.L.P.

(57) ABSTRACT

A semiconductor memory device includes a memory cell, a bit line, a source line, and a sense amplifier. The memory cell has a stacked gate including a charge accumulation layer and a control gate. The bit line is electrically connected to a drain of the memory cell. The source line is electrically connected to a source of the memory cell. The sense amplifier, during erase verification to determine whether or not a threshold voltage of the memory cell in an erased state is at a threshold level, reads the data from the memory cell and senses the data with a first voltage applied to the control gate of the memory cell, with a positive second voltage higher than the first voltage applied to the semiconductor substrate and the source line, and with a third voltage higher than the second voltage applied to the bit line.

4 Claims, 19 Drawing Sheets

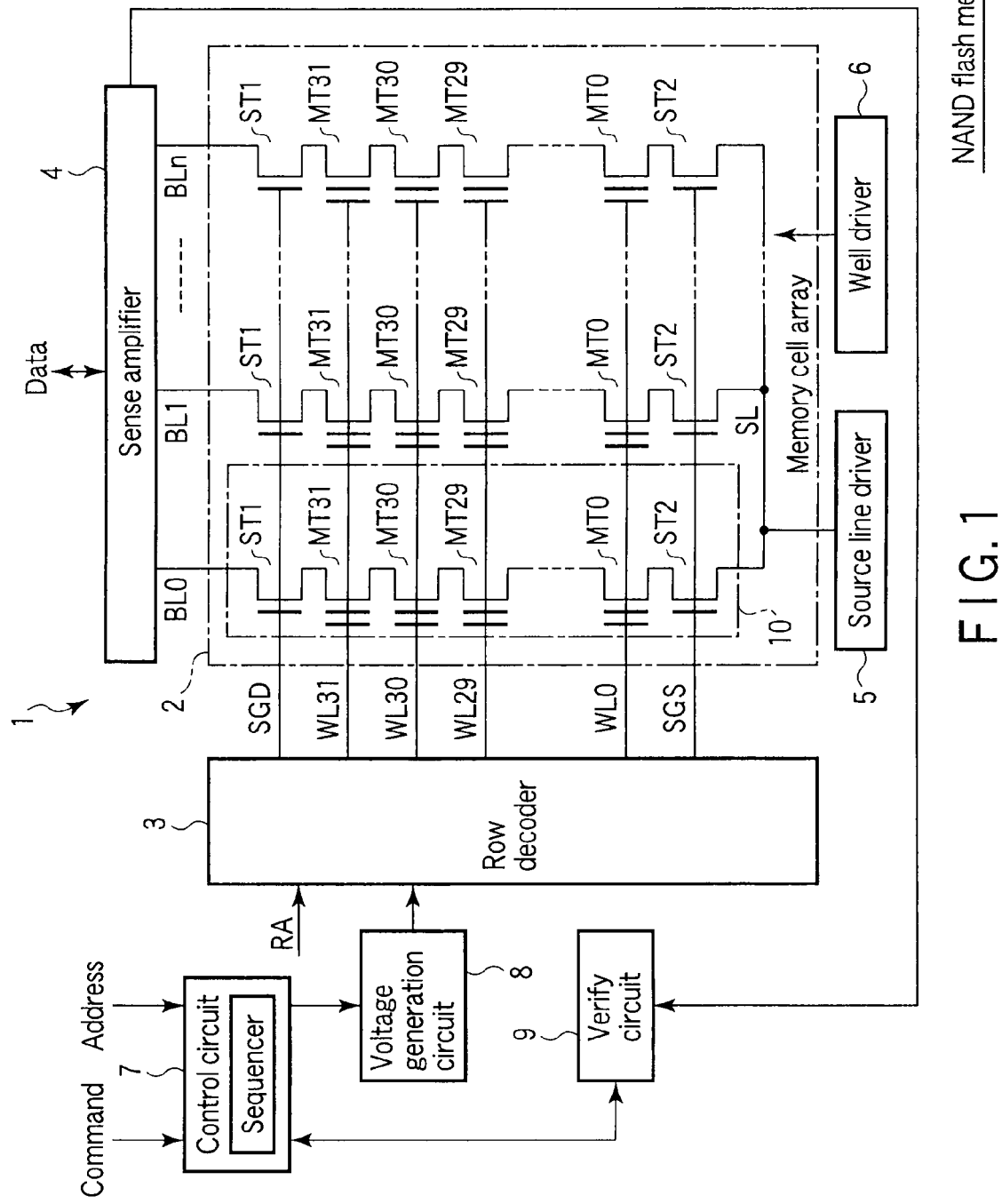
F I G. 1

Erase sequence

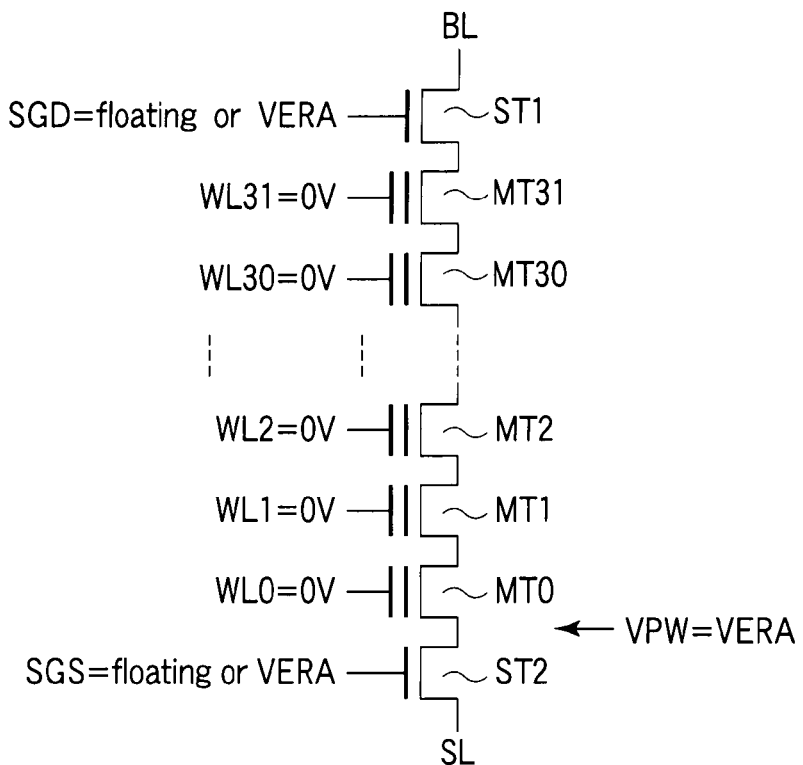
F I G. 14
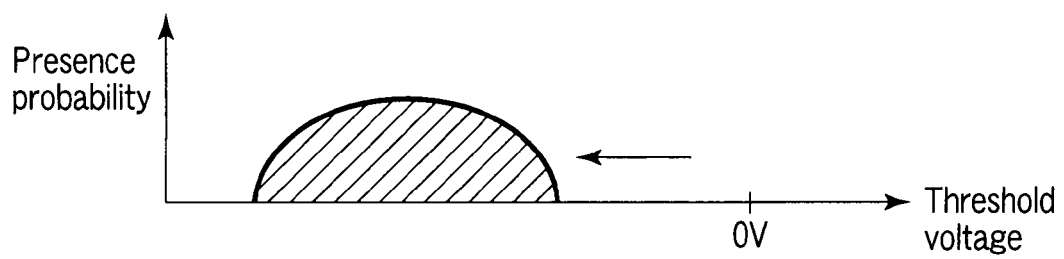
F I G. 15

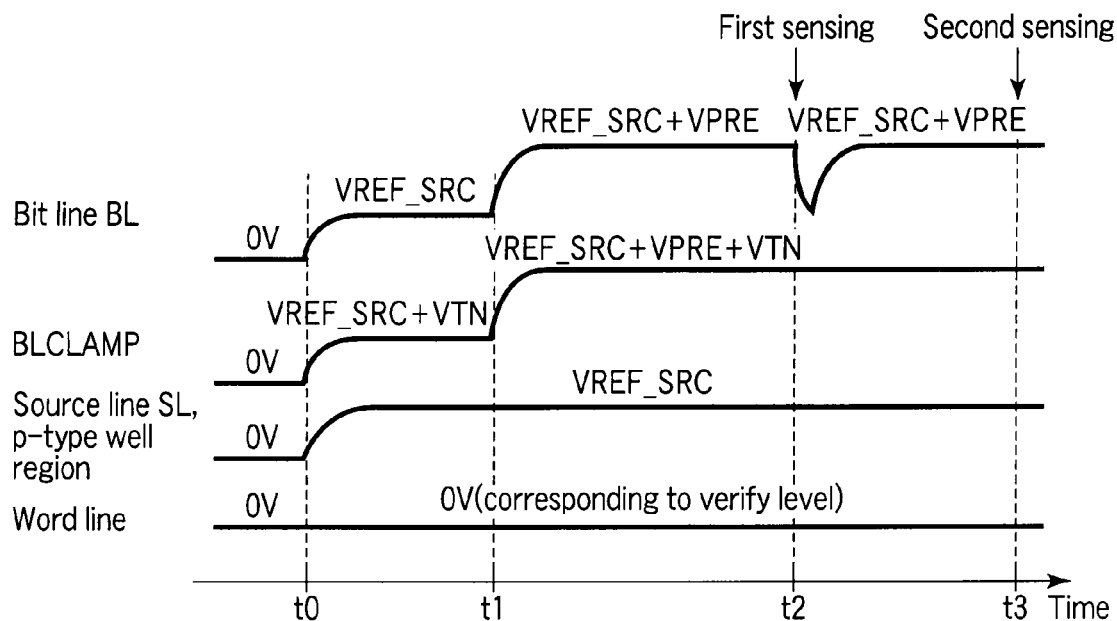
F I G. 16
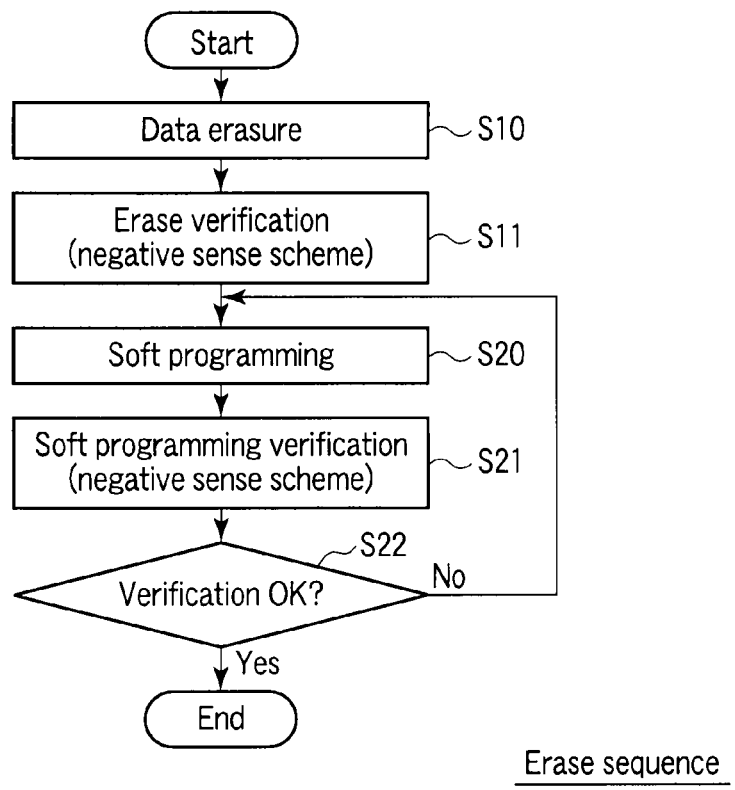
F I G. 17

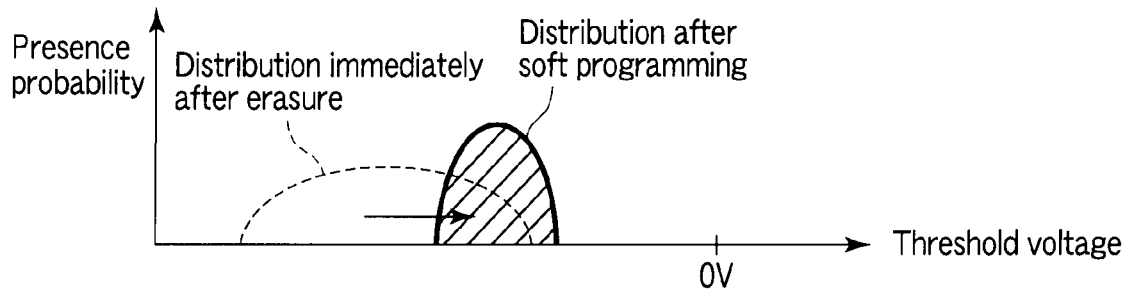
F I G. 18
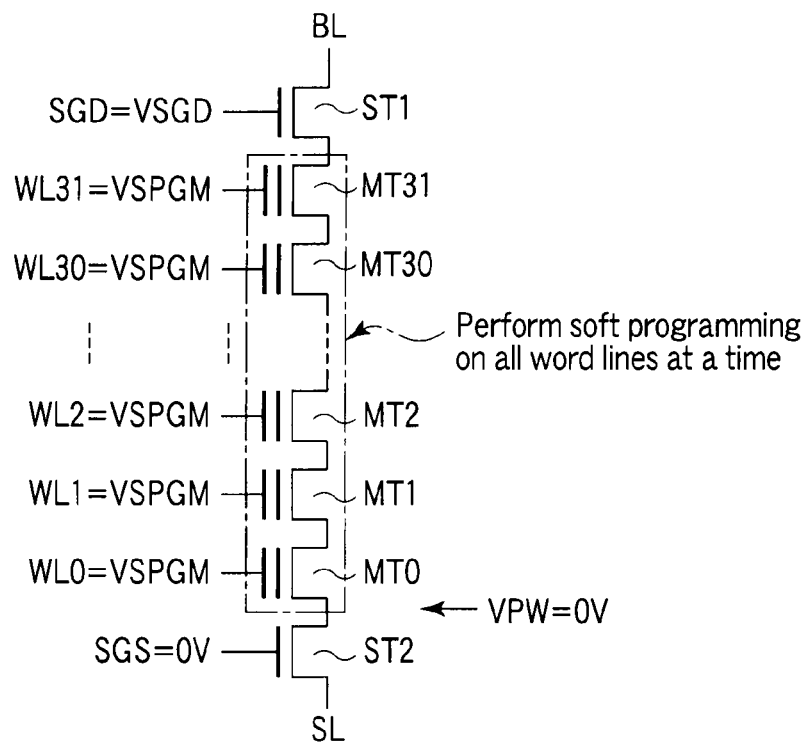
F I G. 19

Erase sequence(L<M<N)

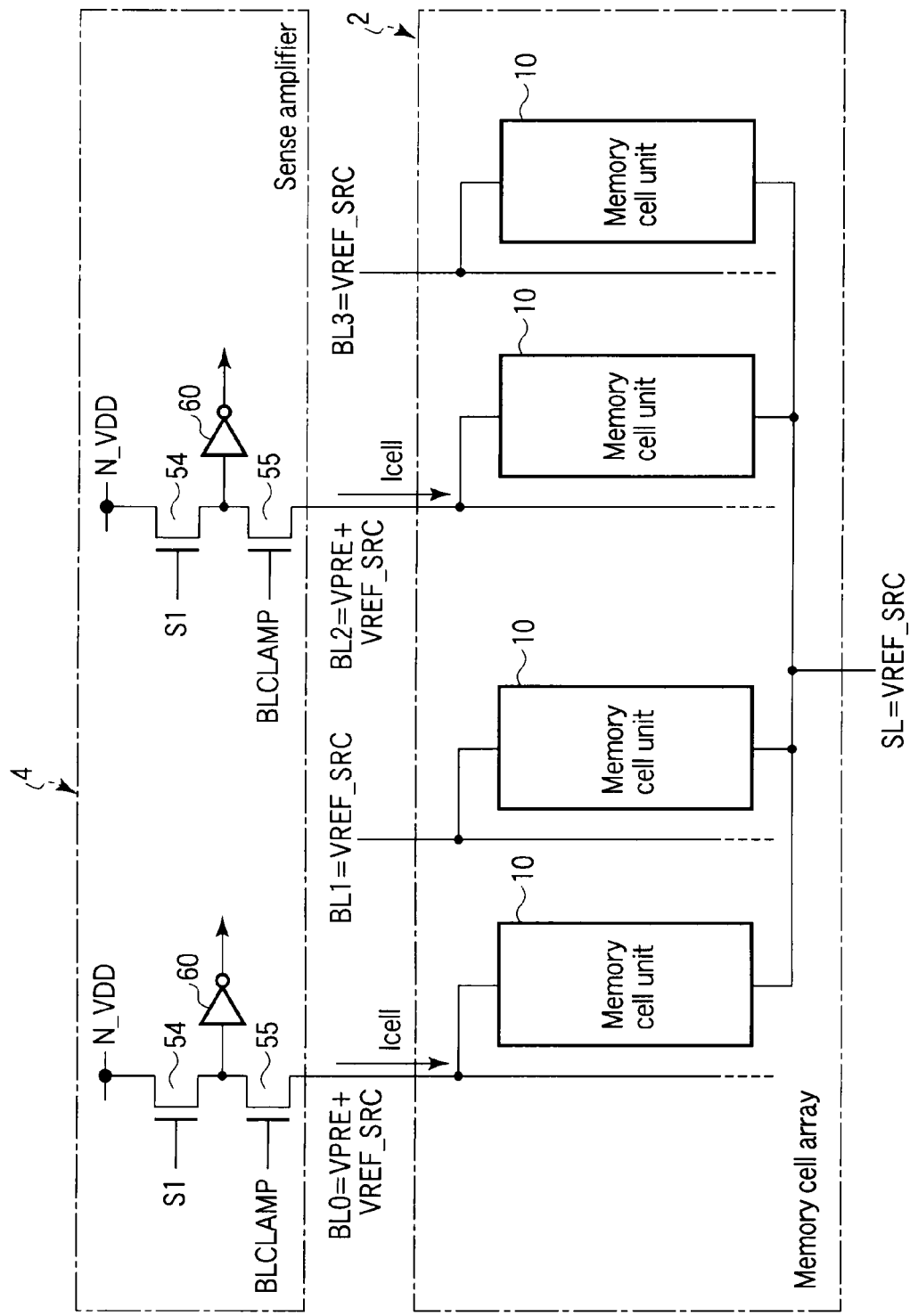
F I G. 24

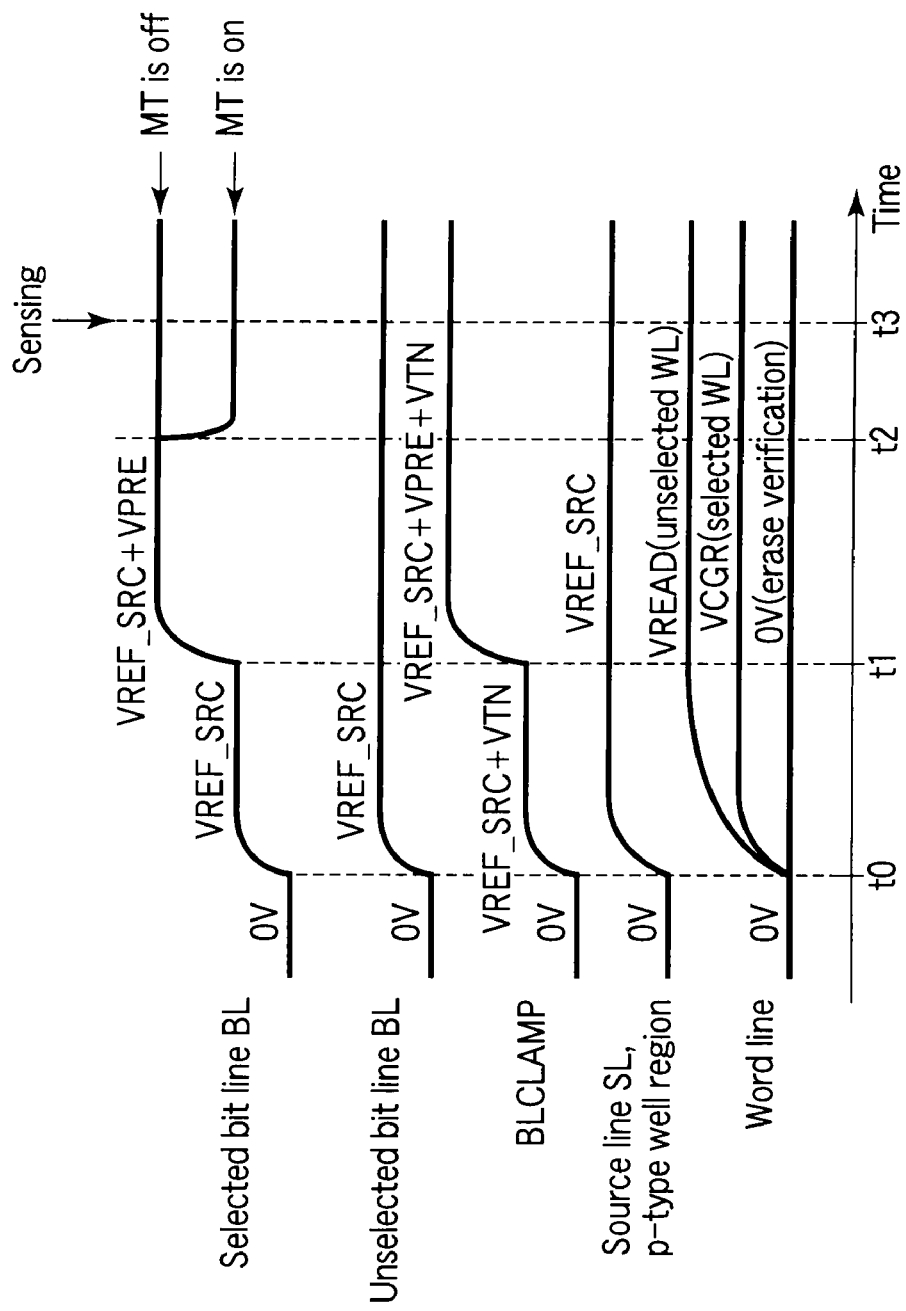
F I G. 25

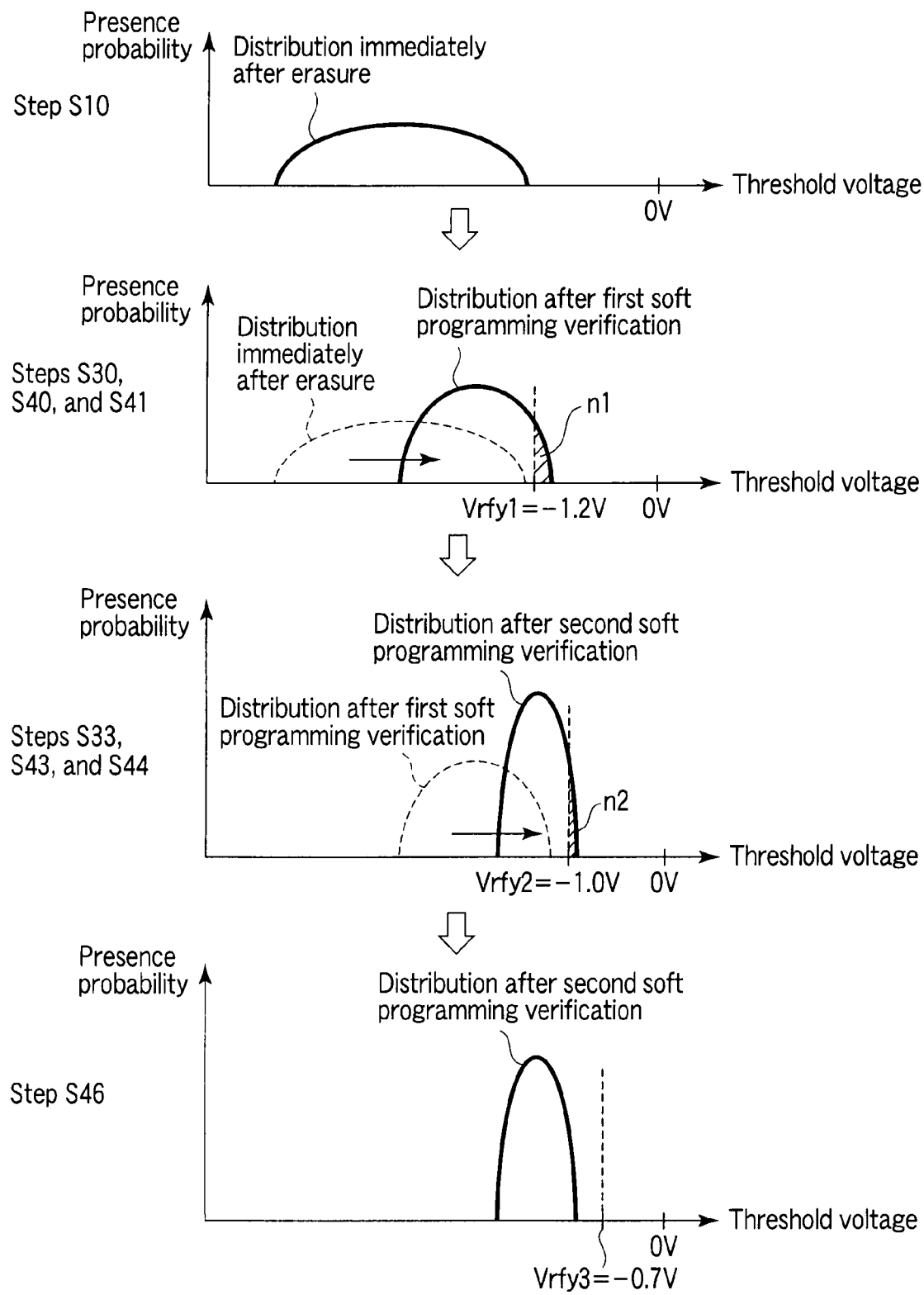
F I G. 27

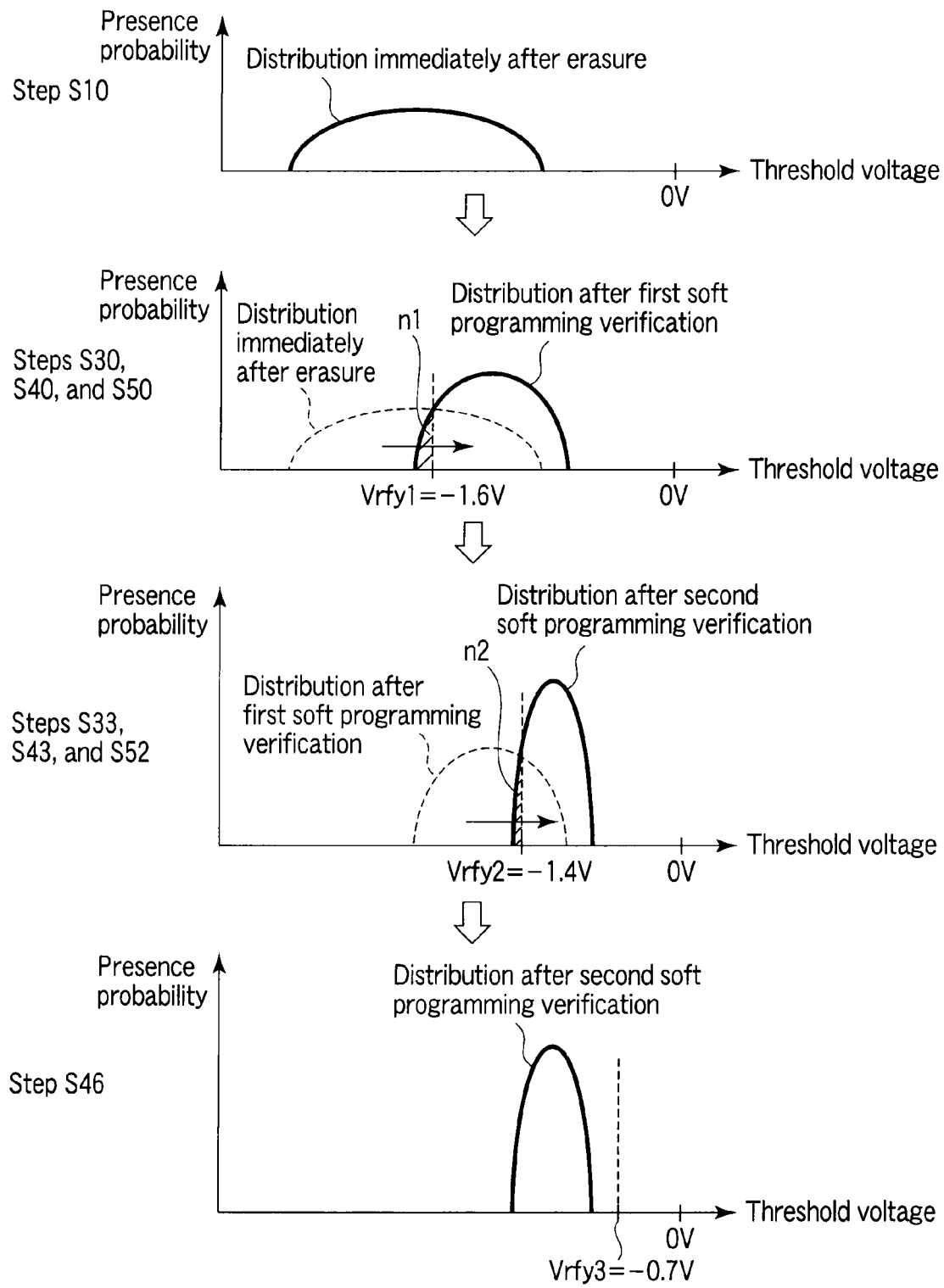
F I G. 29

SEMICONDUCTOR MEMORY DEVICE COMPRISING MEMORY CELL HAVING CHARGE ACCUMULATION LAYER AND CONTROL GATE AND METHOD OF ERASING DATA THEREOF

CROSS-REFERENCE TO RELATED APPLICATIONS

This application is based upon and claims the benefit of priority from prior Japanese Patent Application No. 2008-076578, filed Mar. 24, 2008, the entire contents of which are incorporated herein by reference.

BACKGROUND OF THE INVENTION

1. Field of the Invention

The present invention relates to a semiconductor memory device and a method of erasing data thereof.

2. Description of the Related Art

A NAND flash memory is conventionally known as a nonvolatile semiconductor memory. In the NAND flash memory, data erasure is performed at a time on each block that is a set of memory cells.

Various data erase sequences have been proposed. A technique is well known which performs soft programming and verification for the soft programming after an erase verify operation. The soft programming is an operation of programming a memory cell in an erased state to shift the threshold voltage of the memory cell in a positive direction.

In the conventional soft programming, all word lines in the same block are selected and all the memory cells in the same block are programmed at a time. Such a technique is disclosed in, for example, Jpn. Pat. Appln. KOKAI Publication No. 2007-305204.

BRIEF SUMMARY OF THE INVENTION

A semiconductor memory device according to an aspect of the present invention includes:

a memory cell formed on a semiconductor substrate and having a stacked gate including a charge accumulation layer and a control gate, the memory cell being configured to hold data of at least two levels;

a bit line electrically connected to a drain of the memory cell and transferring data;

a source line electrically connected to a source of the memory cell; and a sense amplifier which, during erase verification to determine whether or not a threshold voltage of the memory cell in an erased state is at a threshold level, reads the data from the memory cell and senses the data with a first voltage applied to the control gate of the memory cell, with a positive second voltage higher than the first voltage applied to the semiconductor substrate and the source line, and with a third voltage higher than the second voltage applied to the bit line.

A method of erasing data of a semiconductor memory device, the method according to an aspect of the present invention includes:

erasing data from N (N is a natural number of at least two) memory cells at a time, the memory cells each including a charge accumulation layer and a control gate; and after the data erasure, reading the data from each of the memory cells with a first voltage applied to the control gate, with a positive second voltage higher than the first voltage applied to a semiconductor substrate on which the memory cells are formed and to a source of the memory cell, and with a third voltage higher than the second voltage applied to a drain of the memory cell, to perform a first erase verification to determine whether or not a threshold voltage of the memory cell is at a predetermined threshold level.

BRIEF DESCRIPTION OF THE SEVERAL VIEWS OF THE DRAWING

FIG. 1 is a block diagram of a flash memory according to a first embodiment of the present invention;

FIG. 14 is a circuit diagram of the memory cell unit according to the first embodiment;

FIG. 15 is a graph showing the threshold distribution of the memory cell according to the first embodiment, that is, a change in threshold during erasure;

FIG. 16 is a timing chart of various voltages during erase verification in the flash memory according to the first embodiment;

FIG. 17 is a flowchart showing an erase sequence in a flash memory according to a second embodiment of the present invention;

FIG. 18 is a graph showing the threshold distribution of a memory cell according to the second embodiment, that is, a change in threshold during soft programming;

FIGS. 19 and 20 are circuit diagrams of a memory cell unit according to the second embodiment;

FIG. 24 is a circuit diagram of a sense amplifier and a memory cell unit according to a fifth embodiment of the present invention;

FIG. 25 is a timing chart of various voltages obtained during the read operation in the flash memory according to a fifth embodiment;

FIG. 27 is a graph showing the threshold distribution of a memory cell according to the sixth embodiment;

FIG. 29 is a graph showing the threshold distribution of a memory cell according to a seventh embodiment.

DETAILED DESCRIPTION OF THE INVENTION

[First Embodiment]

Figure 2:
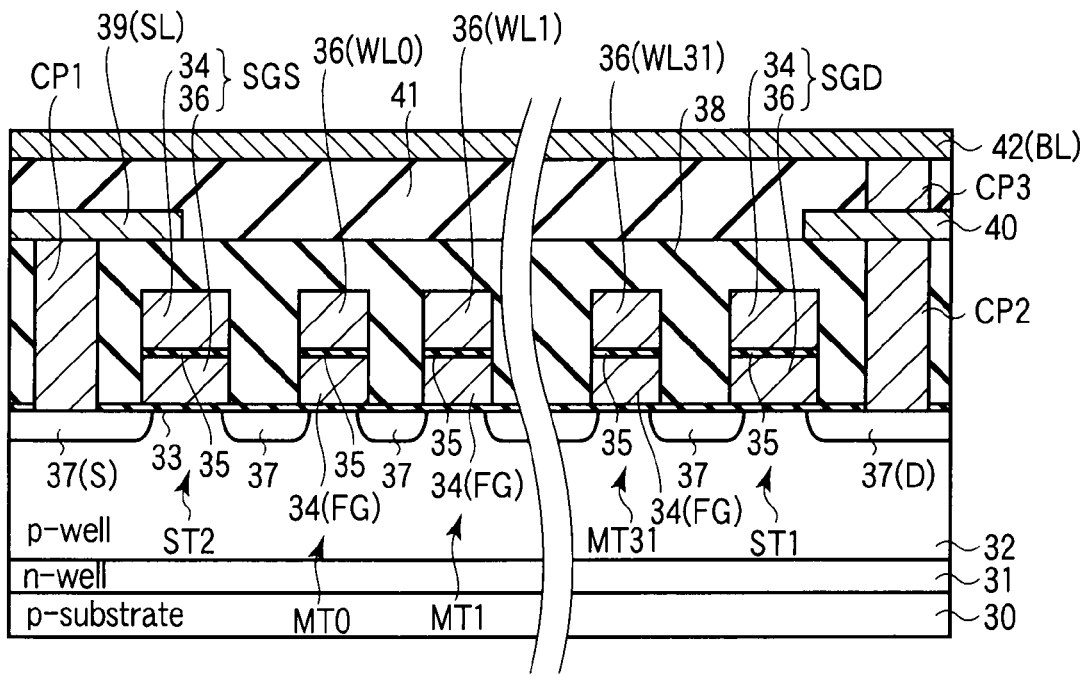
FIG. 2 is a sectional view of the memory cell array according to the first embodiment.

A semiconductor memory device and a method of erasing data from the semiconductor memory device according to a first embodiment will be described citing a NAND flash memory by way of example.

<Configuration of the NAND Flash Memory>

FIG. 1 is a block diagram of a NAND flash memory according to the present embodiment. As shown in FIG. 1, a flash memory 1 includes a memory cell array 2, a row decoder 3, a sense amplifier 4, a source line driver 6, a well driver 6, a control circuit 7, a voltage generation circuit 8, and a verify circuit 9.

First, the memory cell array 2 will be described. The memory cell array 2 includes a plurality of memory cell units 10. Each of the memory cell units 10 includes, for example, 32 memory cell transistors MT0 to MT31 and select transistors ST1 and ST2. If the memory cell transistors MT0 to MT31 are not distinguished from one another below, the memory cell transistors MT0 to MT31 are collectively referred to as the memory cell transistors MT. A memory cell transistor MT includes a stacked gate structure having a charge accumulation layer (for example, a floating gate) formed on a semiconductor substrate with a gate insulating film interposed therebetween and a control gate formed on the charge accumulation layer with an inter-gate insulating layer interposed therebetween. The number of memory cell transistors MT is not limited to 32 but may be 8, 16, 64, 128, 256, or the like; no limitation is imposed on the number of memory cell transistors MT. The adjacent memory cell transistors MT share a source and a drain. The memory cell transistors MT are arranged between the select transistors ST1 and ST2 so that current paths in the memory cell transistors MT are connected together in series. A drain of one of the series-connected memory cell transistors MT which is located at one end of the arrangement of memory cell transistors MT is connected to a source of select transistor ST1. A source of one of the series-connected memory cell transistors MT which is located at the other end of the arrangement is connected to a drain of select transistor ST2.

Control gates of the memory cell transistors MT on the same row are connected commonly to one of word lines WL0 to WL31. Gates of memory cell select transistors ST1 on the same row are connected commonly to a select gate line SGD. Gates of memory cell select transistors ST2 on the same row are connected commonly to a select gate line SGS. For simplification of description, the word lines WL0 to WL31 are sometimes referred to as word lines WL. Furthermore, drains of select transistor ST1 on the same column in the memory cell array 2 are connected commonly to one of bit lines BL0 to BLn (n is a natural number). The bit lines BL0 to BLn are also sometimes simply referred to as the bit lines BL. Sources of select transistors ST2 are connected commonly to a source line SL. Both the select transistors ST1 and ST2 are not required, and one of the select transistors ST1 and ST2 may be omitted provided that the remaining select transistor enables any of the memory units 11 to be selected.

FIG. 1 shows only one row of memory cell unit 10. However, a plurality of rows of the memory cell units 10 may be provided in the memory cell array 2. In this case, the memory cell units 10 on the same column are connected to the same bit line BL. Furthermore, data is written to the plurality of memory cell transistors MT connected to the same word line WL at a time. This unit is called a page. Data is erased from the plurality of memory cell units 11 on the same row at a time. This unit is called a memory block.

Now, the configuration of the memory cell unit 10, provided in the memory cell array 2, will be described with reference to FIG. 2. FIG. 2 is a sectional view of the memory cell unit 10 taken along a bit line direction of the memory cell unit 10.

As shown in FIG. 2, an n-type well region 31 is formed in a surface region of a p-type semiconductor substrate 30. A p-type well region 32 is formed in a surface region of the n-type well region 31. A gate insulating film 33 is formed on the p-type well region 32. Gate electrodes of the memory cell transistors MT and the select transistors ST1 and ST2 are formed on the gate insulating film 33. The gate electrodes of the memory cell transistors MT and the select transistors ST1 and ST2 each have a polycrystalline silicon layer 34 formed on the gate insulating film 33, an inter-gate insulating film 35 formed on the polycrystalline silicon layer 34, and a polycrystalline silicon layer 36 formed on the inter-gate insulating film 35. The inter-gate insulting film 35 is formed of, for example, a silicon oxide film, or an ON film, an NO film, or an ONO film which is a stacked structure of a silicon oxide film and a silicon nitride film, or a stacked structure including any of the silicon oxide film, the ON film, the NO film, and the ONO film, or a stacked structure of a $TiO_2$, $HfO_2$, $Al_2O_3$, $HfAlO_x$, or HfAlSi film, and silicon oxide film or a silicon nitride film. The gate insulating film 33 functions as a tunnel insulating film.

In a memory cell transistor MT, the polycrystalline silicon layer 34 functions as a floating gate (FG). On the other hand, the polycrystalline silicon layers 36 arranged adjacent to each other in a direction orthogonal to the bit lines are connected together and function as a control gate (word line WL). In the select transistors ST1 and ST2, the polycrystalline silicon layers 34 and 36 arranged adjacent to each other in a word line direction are connected together. The polycrystalline silicon layers 34 and 36 thus function as the select gate line SGS or SGD. Alternatively, the polycrystalline silicon layers 34 alone may function as the select gate line. In this case, the potential of the polycrystalline silicon layers 36 in the select transistors ST1 and ST2 are set at a constant value or in a floating state. An $n^+$-type impurity diffusion layer 37 is formed in a surface of the semiconductor substrate 30 between the gate electrodes. The impurity diffusion layer 37 is shared by the adjacent transistors and functions as a source (S) or a drain (D). An area between the source and the adjacent drain functions as a channel region through which electrons migrate. The gate electrode, the impurity diffusion layer 37, and the channel region form a MOS transistor making up the memory cell transistor MT or select transistor ST1 or ST2.

An interlayer insulating film 38 is formed on the semiconductor substrate 30 so as to cover the memory cell transistors MT and the select transistors ST1 and ST2. A contact plug CP1 is formed in the interlayer insulating film 38 so as to reach the impurity diffusion layer (source) 37 of the source-side select transistor ST2. A metal wiring layer 39 connected to the contact plug CP1 is formed on the interlayer insulating film 38. The metal wiring layer 39 functions as a part of the source line SL. Furthermore, a contact plug CP2 is formed in the interlayer insulating film 38 so as to reach the impurity diffusion layer (drain) 37 of the drain-side select transistor ST1. A metal wiring layer 40 connected to the contact plug CP2 is formed on the interlayer insulating film 38.

An interlayer insulating film 41 is formed on the interlayer insulating film 38 so as to cover the metal wiring layers 39 and 40. A contact plug CP3 is formed in the interlayer insulating film 41 so as to reach the metal wiring layer 40. A metal wiring layer 42 connected to a plurality of the contact plugs CP3 is formed on the interlayer insulating film 41. The metal wiring layer 42 functions as the bit line BL.

Figure 3:
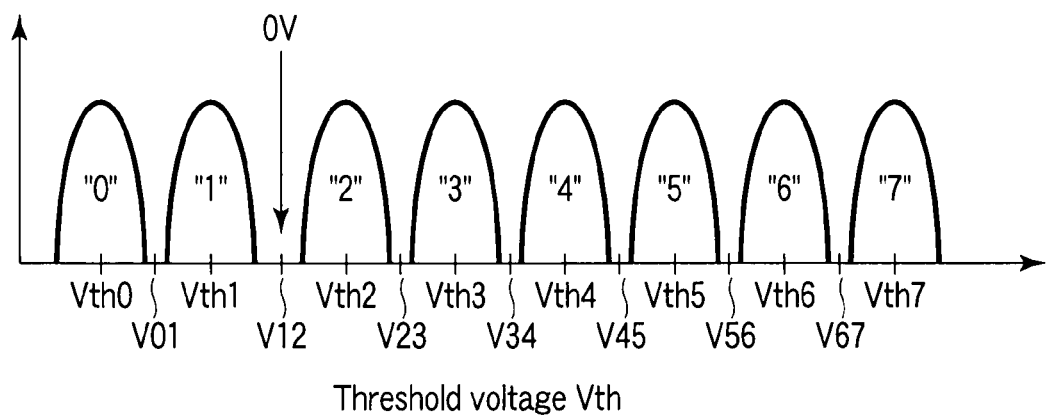
FIG. 3 is a graph showing the threshold distribution of the memory cell according to the first embodiment.

Now, the threshold distributions of the memory cell transistor will be described with reference to FIG. 3. In FIG. 3, the abscissa indicates a threshold voltage Vth. The ordinate indicates the presence probability of the memory cell transistor MT.

As shown in FIG. 3, each memory cell transistor MT can hold data of 8 levels (3 bit data). That is, the memory cell transistor MT can hold eight types of data of "0", "1", "2", "3", . . . , "7" in order of increasing threshold voltage Vth. A threshold voltage Vth0 for the "0" data in the memory cell transistor MT is Vth0<V01. A threshold voltage Vth1 for the "1" data is V01<Vth1<V12. A threshold voltage Vth2 for the "2" data is V12<Vth2<V23. A threshold voltage Vth3 for the "3" data is V23<Vth3<V34. A threshold voltage Vth4 for the "4" data is V34<Vth4<V45. A threshold voltage Vth5 for the "5" data is V45<Vth5<V56. A threshold voltage Vth6 for the "6" data is V56<Vth6<V67. A threshold voltage Vth7 for the "7" data is V67<Vth7.

For example, voltage V12 is 0 V. That is, the threshold voltages Vth0 and Vth1 for the "0" data and the "1" data have negative values. The threshold voltages Vth2 to Vth7 for the "2" and "7" data have positive values. A voltage V(i−1)i for "i" data (i is one of 1 to 7) is hereinafter referred to as the "read level" of the "i" data. That is, voltage V01 is the read level of the "1" data. Voltage V12 is the read level of the "2" data. For the "1" to "7" data, the read level of the "1" data has a negative value, the read level of the "2" data is zero, and the read levels of the data larger than the "2" data have positive values.

The read level corresponding to 0 V is not limited to V12 but may be voltage V23, V34, or V01. Furthermore, the data that can be held by the memory cell transistor MT is not limited to the 8 levels. For example, the data may be 2 levels (1 bit data), 4 levels (2 bit data), 16 levels (4 bit data), or the like.

Referring back to FIG. 1, the configuration of the flash memory 1 will be described. The row decoder 3 applies voltages to any of the select gate lines SGD and SGS and the word lines WL during a data write operation, a data read operation, and a data erase operation. For a data write operation, the row decoder 3 applies a voltage to the select gate line SGD to turn on select transistor ST1. The row decoder 30 applies 0 V to the select gate line SGS to turn off select transistor ST2. Moreover, the row decoder 30 selects any of the word lines WL and applies a program voltage VPGM to the selected word line. The row decoder 30 applies a voltage VPASS to unselected word lines. The program voltage VPGM is a high voltage (for example, 20 V) required to inject electrons into the charge accumulation layer by Fowler-Nordheim (FN) tunneling. Voltage VPASS turns on the memory cell transistor MT regardless of the data held in the memory cell transistor MT. The data erase operation and the data read operation will be described below in detail.

Figure 4:
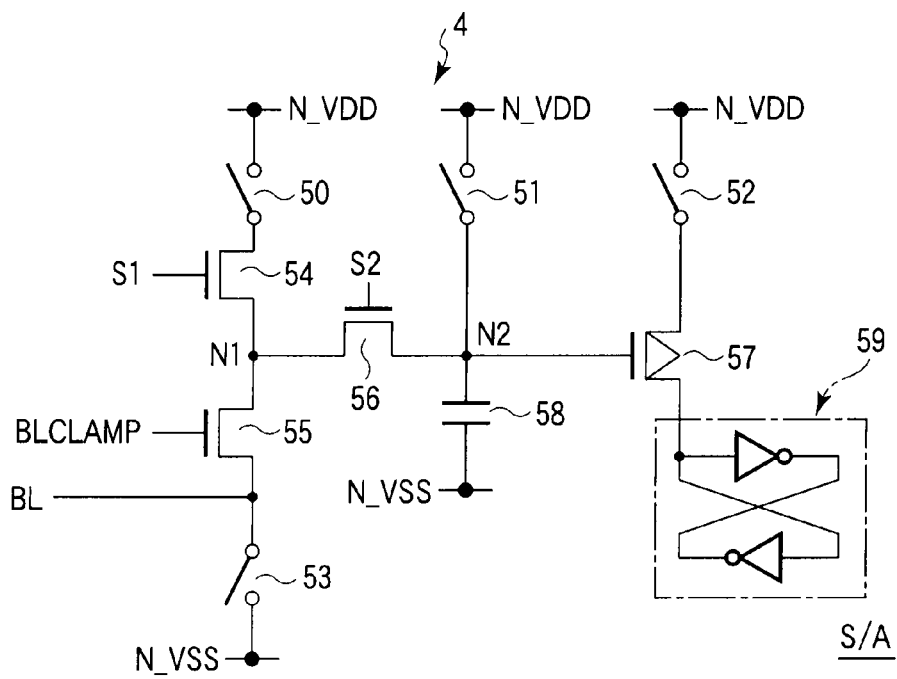
FIGS. 4 and 5 are each a circuit diagram of a sense amplifier and a memory cell unit according to the first embodiment.

Now, the sense amplifier 4 will be described. For the data read operation, the sense amplifier 4 senses and amplifies data read from the memory cell transistor MT onto the bit line BL. For the data write operation, the sense amplifier transfers write data to the corresponding bit line BL. The configuration of the sense amplifier 4 will be described with reference to FIG. 4. FIG. 4 is a circuit diagram of the sense amplifier 20, showing particularly an arrangement corresponding to one bit line. Thus, the sense amplifier 4 includes the arrangements one of which is shown in FIG. 4 and which correspond to the respective bit lines BL.

As shown in FIG. 4, the sense amplifier 4 includes switch elements 50 to 53, n-channel MOS transistors 54 to 56, a p-channel MOS transistor 57, a capacitor element 58, and a latch circuit 59. One end of a current path in MOS transistor 54 is connected to a node N_VDD via the switch element 50. The other end of the current path is connected to a node N1. A signal S1 is input to a gate of MOS transistor 54. One end of a current path in MOS transistor 55 is connected to the node N1. The other end of the current path is connected to the bit line BL. A signal BLCLAMP is provided to a gate of MOS transistor 55. That is, MOS transistor 55 switches the connection between the bit line BL and the node N1 according to signal BLCLAMP. One end of a current path in MOS transistor 56 is connected to the node N1. The other end of the current path is connected to a node N2. A signal S2 is provided to a gate of MOS transistor 56. The node N2 is connected to a node N_VDD via a switch element 141. One electrode of the capacitor element 58 is connected to the node N2. The other electrode is connected to a node N_VSS. One end of a current path in MOS transistor 57 is connected to the node N_VDD via the switch element 52. The other end of the current path is connected to the latch circuit 59. A gate of MOS transistor 57 is connected to the node N2. The switch element 53 connects the bit line BL to the node N_VSS depending on data held in the latch circuit 59.

The node N_VDD functions as a power supply voltage node for the sense amplifier 4 and is provided with, for example, a voltage (VDD+VREF_SRC). A voltage VDD is an internal power source (for example, 1.5 V) for the flash memory 1. A voltage VREF_SRC is provided to the source line SL by the source line control circuit 5 described below. The node N_VSS functions as a ground node for the sense amplifier 4 and is provided with, for example, a voltage (VSS+VREF_SRC). Voltage VSS is a ground potential (0 V).

Referring back to FIG. 1, the configuration of the flash memory 1 will further be described. The source line driver 5 provides a voltage to the source line SL. For the data read operation, the source line driver 5 applies voltage VREF_SRC (positive voltage) to the source line SL.

The well driver 6 applies voltages to the well region 32, in which the memory cell array 2 is formed. For the data read operation and the data write operation, the well driver 6 applies voltage VREF_SRC (positive voltage) and 0 V, respectively, to the well region 32. For the erase operation, the well driver 6 applies an erase voltage VERA (high positive voltage, for example, 20 V) to the well region.

The voltage generation circuit 8 generates a positive voltage based on an instruction from the control circuit 7, and supplies the positive voltage to row decoder 3 and the like. That is, the voltage generation circuit 8 generates voltages VPGM, VPASS, VERA, and the like. Alternatively, the voltage generation circuit 8 may generate voltage VREF_SRC.

The verify circuit 9 receives write data and read data from the sense amplifier 4 to perform a verify operation.

The control circuit 7 receives external commands and addresses. Then, based on the received commands and addresses, the control circuit 7 controls the operation of the circuit blocks described above according to various instructions. Furthermore, the control circuit 7 includes a sequencer to control a series of processing (sequence) in the data write operation, the data erase operation, and the data read operation.

<Operation of the NAND Flash Memory>

Now, the data read and erase operations in the NAND flash memory configured as described above will be described.

<Data Read Operation>

First, the data read operation will be described. The description below also applies to verification performed during the data write operation. That is, the write operation is performed by repeating a data programming operation and a data verify operation. The programming operation causes a difference in potential between the control gate 36 and channel of the memory cell transistor MT to inject electrons into the charge accumulation layer 34. The verify operation reads data from the programmed memory cell transistor MT to determine whether or not the threshold voltage of the memory cell transistor MT has a desired value.

Figure 5:
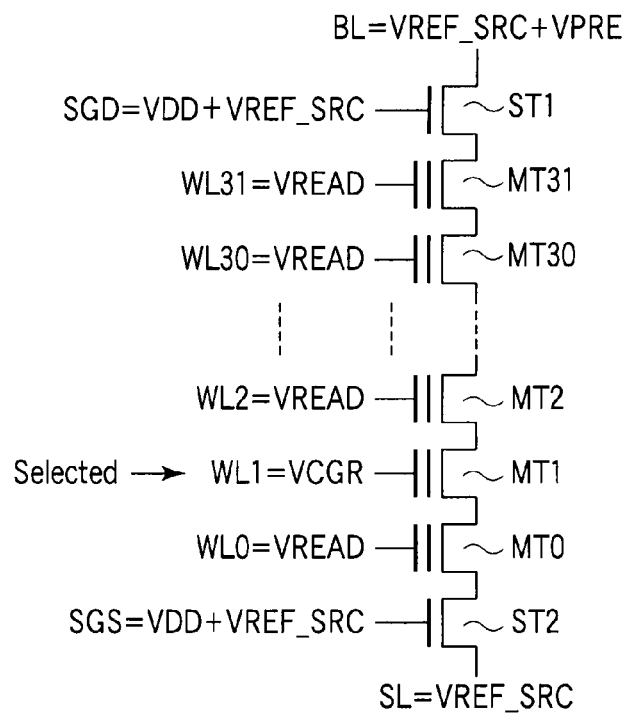

First, the voltage relationship among the signal lines during the read operation will be described with reference to FIG. 5. FIG. 5 is a circuit diagram of the memory cell unit 10 during a data read. In an example described below, the read is performed on the memory cell transistor MT connected to the word line WL1.

First, the sense amplifier 4 (not shown in the drawings) precharges all the bit lines BL via the current path in MOS transistor 50. The source line driver 5 applies voltage VREF_SRC to the source line SL. The well driver 6 applies voltage VREF_SRC to the well region 32.

The row decoder 3 selects the word line WL1 and applies a read voltage VCGR to the selected word line WL1. The row decoder 3 further applies a voltage VREAD to the unselected word lines WL0 and WL2 to WL31. The row decoder 30 further applies voltage (VDD+VREF_SRC) to the select gate lines SGD and SGS.

Voltage VREAD turns on the memory cell transistor MT regardless of the data held in the memory cell transistor MT. Voltage VCGR is applied to the memory cell transistor to be subjected to the read and varies depending on the data to be read. Voltage (VDD+VREF_SRC) applied to the select gate lines SGD and SGS allows the select transistors ST1 and ST2 to be turned on.

When the memory cell transistor MT connected to the selected word line WL1 is turned on, the bit line BL is electrically connected to the source line SL. That is, current flows from the bit line BL to the source line SL. On the other hand, when the memory cell transistor MT connected to the selected word line WL1 is turned off, the bit line BL is electrically isolated from the source line SL. That is, no current flows from the bit line BL to the source line SL. The above-described operations allow the data to be read through all the bit lines at a time.

Now, the voltage relationship among the memory cell transistors MT will be described with reference to FIG. 6, taking a case where the "1" data is read, by way of example.

Figure 6:
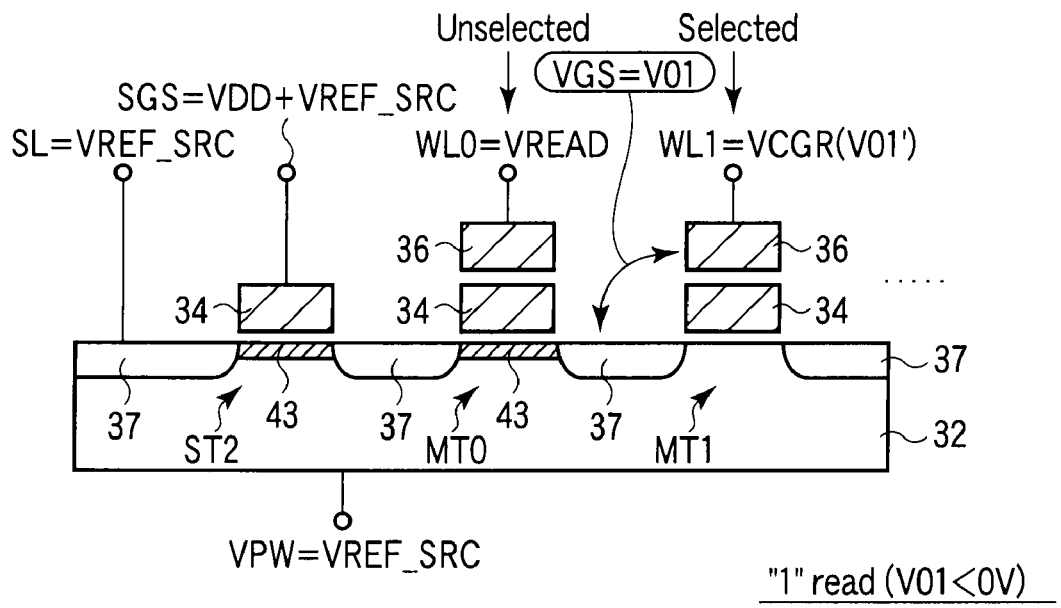
FIG. 6 is a sectional view of a partial region of the memory cell unit according to the first embodiment.

As shown in FIG. 6, voltage VREF_SRC is applied to the source line SL and the well region 32. Voltage (VDD+VREF_SRC) is applied to the select gate line SGS. Voltage VREAD is applied to the word line WL0. Thus, a channel 43 is formed in the select transistor ST2 and memory cell transistor MT0. This also applies to the select transistor ST1 and memory cell transistors MT2 to MT31. Then, voltage VCGR is applied to the selected word line WL1. If the read level is negative, the value of voltage VCGR is equal to voltage VREF_SRC minus the absolute value of the read level. That is, if the "1" data is read, voltage VCGR=V01'=(VREF_SRC−|V01|) and preferably has a value of at least zero. For example, when voltage VREF_SRC=|V01|, voltage VCGR=V01'=0 V.

FIG. 6 shows the read of the "1" data. As described above, the VREF_SRC is applied to the source line SL, and voltage V01' is applied to the selected word line WL. Thus, voltage V01 is applied to memory cell transistor MT1 as a gate-source voltage VGS. Provided that memory cell transistor MT1 holds the "1" data, memory cell transistor MT1 is off, with no cell current flowing through memory cell transistor MT1. In contrast, when memory cell transistor MT1 is turned on, this means that memory cell transistor MT1 holds the "0" data. Thus, with the above-described reading method, reading the "1" data also corresponds to reading the "0" data.

If the read level is zero or positive, the value of voltage VCGR is equal to voltage VREF_SRC plus the read level. That is, if the "2" data is read, since V12=0 V, voltage VCGR=V12'=VREF_SRC. If the "3" data is read, voltage VCGR=V23'=(VREF_SRC+V23).

Figure 7:
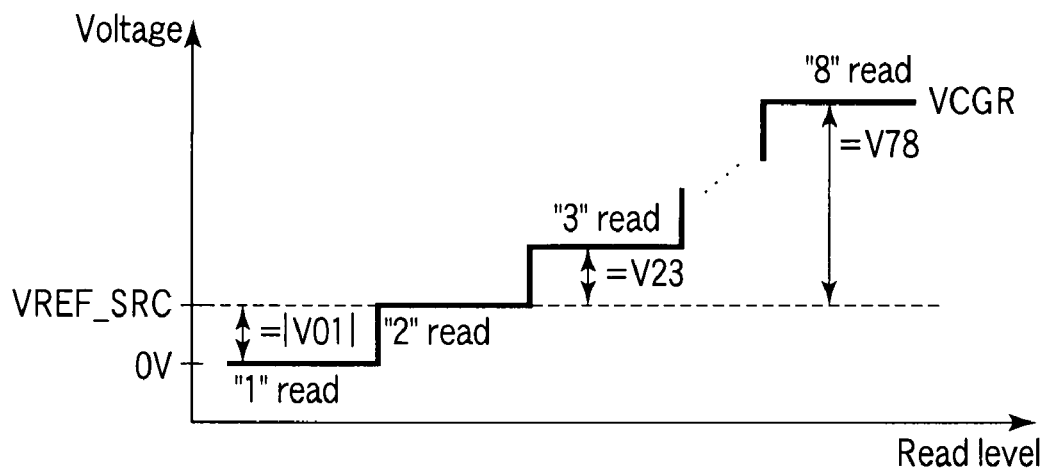
FIG. 7 is a graph showing the relationship between a read level and a voltage VCGR in the flash memory according to the first embodiment.

FIG. 7 is a graph showing the relationship between the read level and voltage VCGR. As shown in FIG. 7, to read data of a negative read level, VCGR is set equal to VREF_SRC minus the absolute value of the read level. To read data of a positive read level, VCGR is set equal to VREF_SRC plus the absolute value of the read level. Then, the voltage of the read level can be applied to between the gate and source of the memory cell transistor MT, with the value of VCGR maintained at least 0.

Now, the operation of the sense amplifier 4 during the read operation will be described with reference to FIGS. 8 to 11. FIGS. 8 to 11 are circuit diagrams of the sense amplifier 4. A condition in which the memory cell transistor MT is turned on for the data read operation is hereinafter referred to as "1" read. A condition in which the memory cell transistor MT is turned off for the data read operation is hereinafter referred to as "0" read. During the read operation, voltages of the signals S1 and S2 are set to (Vt+0.9 V+VREF_SRC) and (Vt+1.2 V+VREF_SRC)), respectively. The voltage of signal BLCLAMP is set to (VTN+0.7 V+VREF_SRC). Vt denotes a threshold voltage for MOS transistors 54 and 56. VTN denotes a threshold voltage for MOS transistor 55.

(CASE 1)

First, CASE 1 in which "1" read is performed will be described.

Figure 8:
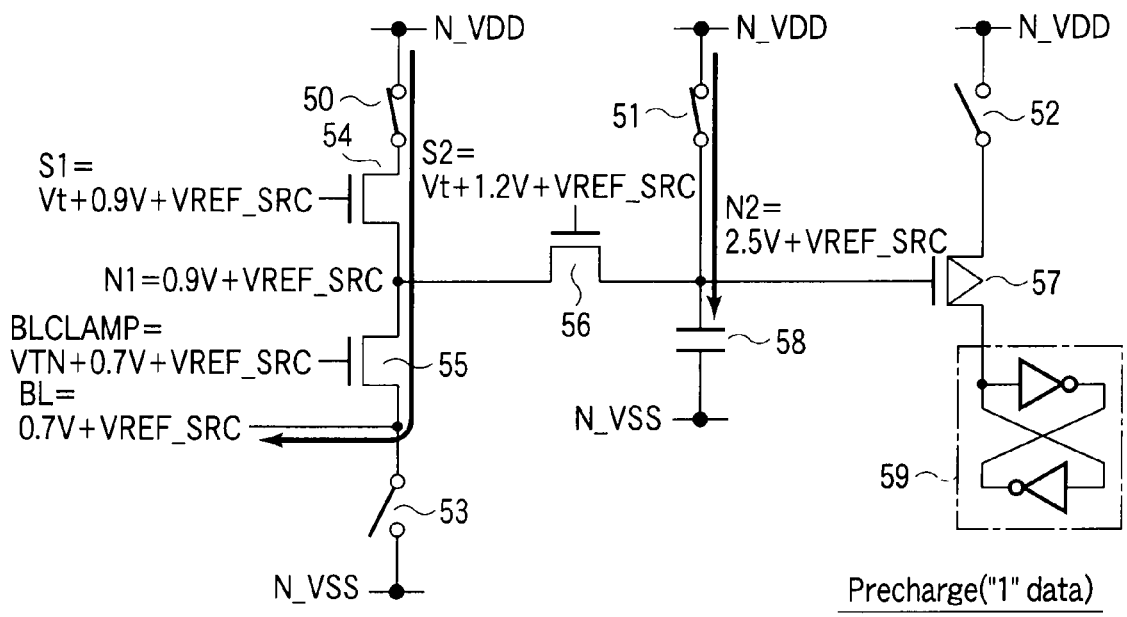
FIGS. 8 to 11 are circuit diagrams of the sense amplifier according to the first embodiment.

First, as shown in FIG. 8, the bit line BL is precharged. It is assumed below that a precharge level VPRE is 0.7 V.

As shown in FIG. 8, the switch element 50 is turned on. Then, since the memory cell unit is electrically conductive, a current flows through the bit line BL via the switch element 50, the current path in MOS transistor 54, the node N1, and the current path in MOS transistor 55. As a result, the potential of the bit line BL is set to about (0.7 V+VREF_SRC). That is, with the current flowing from the bit line BL to the source line SL, the potential of the bit line BL is fixed to (0.7 V+VREF_SRC). Furthermore, since the switch element 51 is turned on, the capacitor element 58 is charged to set the potential of the node N2 to about (2.5 V+VREF_SRC). The switch elements 52 and 53 remain off.

Figure 9:
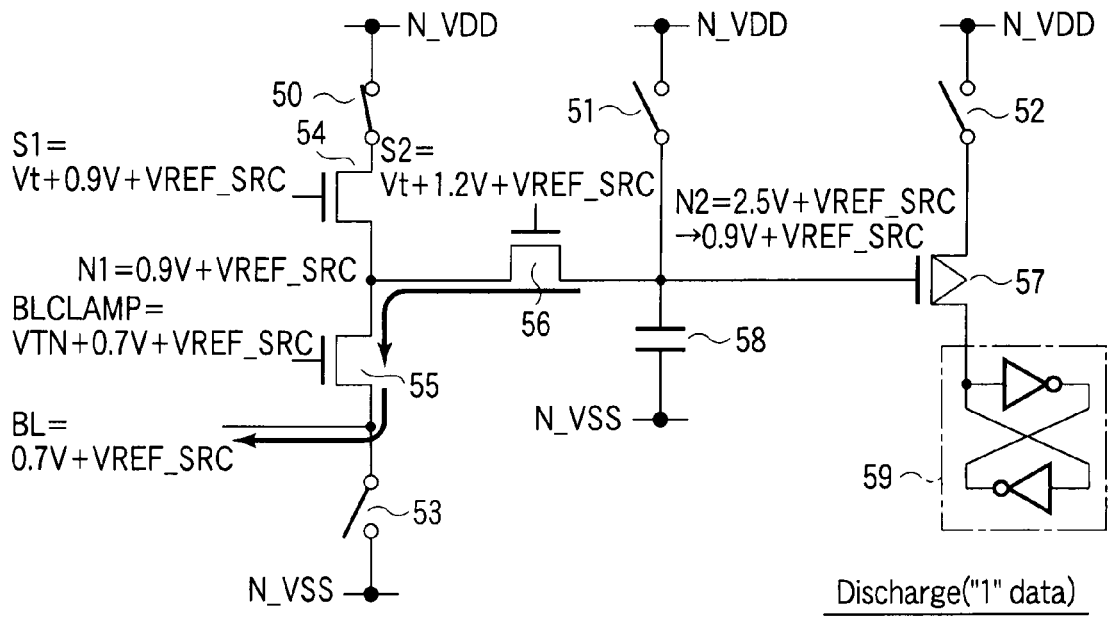

Then, as shown in FIG. 9, the node N2 is discharged. That is, the switch element 51 is turned off. Then, a current flowing from the node N2 to the bit line BL discharges the node N2 to reduce the potential of the node N2 to about (0.9 V+VREF_SRC).

Figure 10:
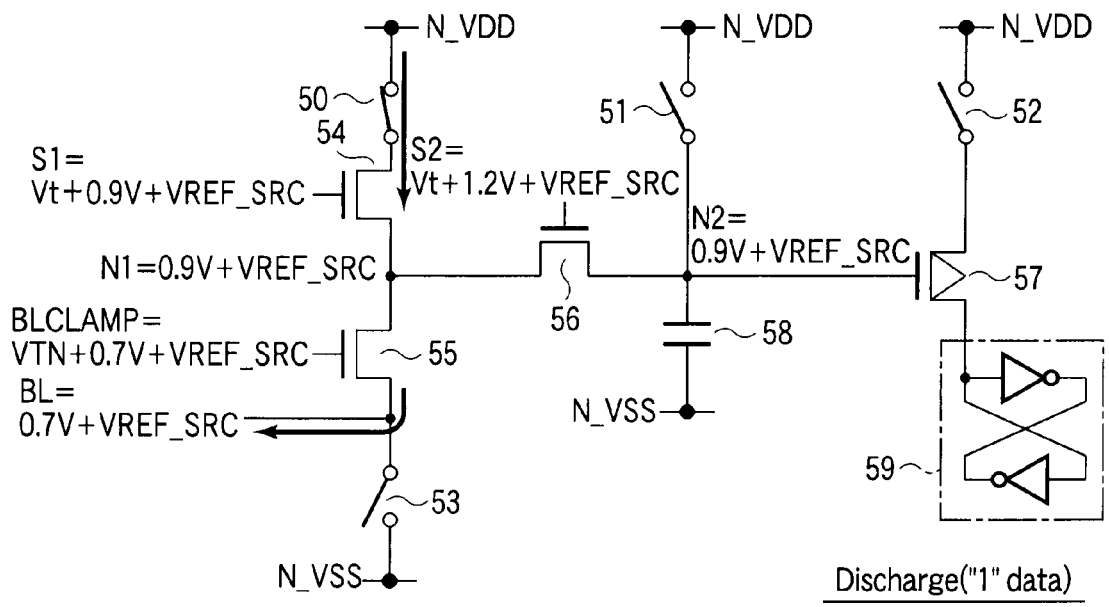

Still referring to FIG. 10, the node N2 is discharged. As shown in FIG. 9, when the potential of the node N1 starts to decrease to (0.9 V+VREF_SRC) or less, MOS transistor 54 starts to supply current. As a result, the potential of the node N1 is maintained at (0.9 V+VREF_SRC).

Figure 11:
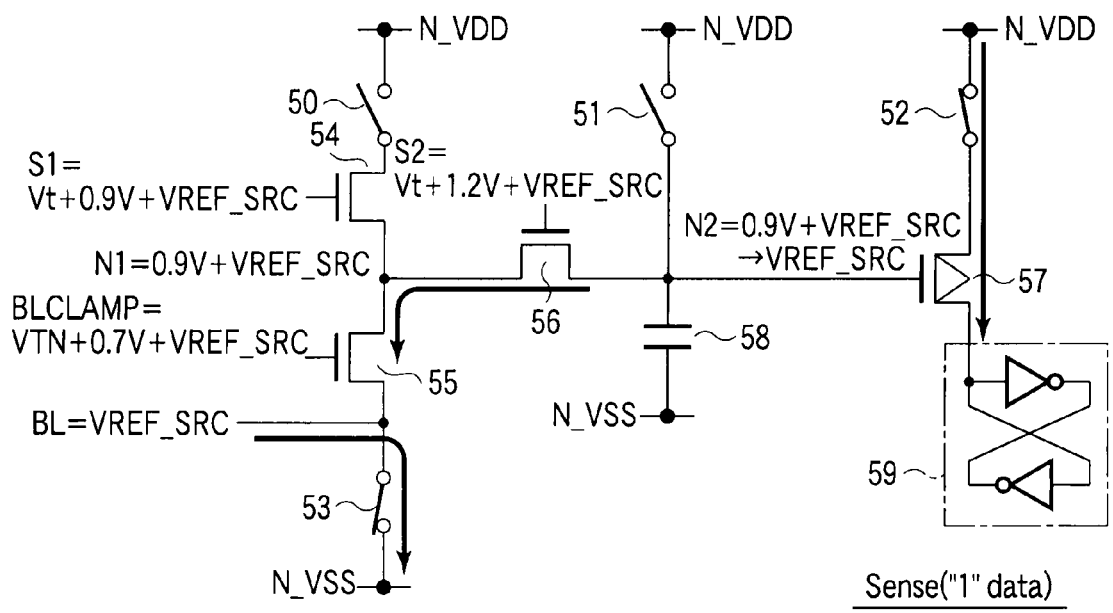

Then, as shown in FIG. 11, data sensing is performed. As shown in the figure, the switch element 52 is turned on. Since the potential of the node N2 is at (0.9 V+VREF_SRC), MOS transistor is 57 is turned on. Thus, the latch circuit 59 holds voltage (VDD+VREF_SRC). Since the latch circuit 59 holds (VDD+VREF_SRC), the switch element 50 is turned off, and the switch element 53 is turned on. Consequently, the potential of the node N2 is set to VREF_SRC. As a result, the latch circuit 59 continues to hold voltage VDD. Furthermore, a current flows from the bit line BL to the node N_VSS via the switch element 53. The potential of the bit line BL is thus set to VREF_SRC.

That is, the data read operation is performed by the sense amplifier 4 by sensing the current flowing through the bit line BL.

Furthermore, in the present embodiment, every time data is read, the processing from precharging through sensing shown in FIGS. 8 to 11 is carried out once or plural times, for example, twice. That is, during the first read, data is read from the memory cell transistor MT through which the cell current flows smoothly and then from the memory cell transistor MT through which the cell current fails to flow smoothly. This is to inhibit the adverse effect of noise (variation) in the source line SL. The second read is performed with the memory cell transistor MT turned on during the first read, turned off.
(CASE II)

Now, CASE II in which "0" read is performed will be described.

In this case, no current flows through the bit line BL, the potential of which is then maintained constant at (0.7 V+VREF_SRC). The potential of the node N2 is maintained at about (2.5 V+VREF_SRC). Thus, MOS transistor 57 is turned off. The latch circuit 59 holds voltage VREF_SRC. This turns on the switch element 50 and turns off the switch element 53. The potential of the node N2 is maintained at (2.5 V+VREF_SRC). The latch circuit 59 continues to hold voltage (VREF_SRC).

Figure 12:
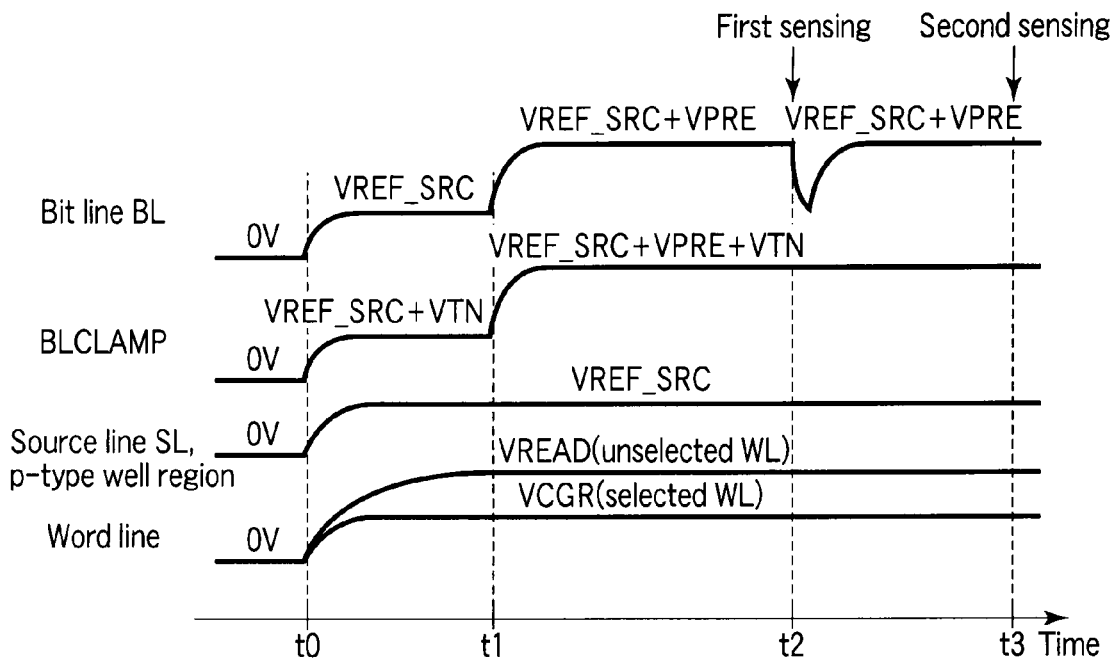
FIG. 12 is a timing chart of various voltages during a read operation in the flash memory according to the first embodiment.

The voltages of the bit line BL, signal BLCLAMP, the source line SL, the p-type well region 32, and the word line WL during the above-described read operation will be described with reference to FIG. 12. FIG. 12 is a timing chart showing variations in the voltages of the various signals during the read operation.

As shown in FIG. 12, at time t0, the read operation is started. At time t0, the row decoder 3 applies voltage VCGR to the selected word line WL, while applying voltage VREAD to the unselected word lines WL. Voltage VCGR has any of the values described with reference to FIG. 7.

The bit line driver (not shown in the drawings) generates a voltage (VREF_SRC+VTN) as signal BLCLAMP. As a result, MOS transistor 55 is turned on. Consequently, the bit line BL and the node N1 are electrically connected together.

The sense amplifier 4 sets the potential of the bit line BL to VREF_SRC. The source line driver 5 and the well driver 6 apply voltage VREF_SRC to the source line SL and the well region 32, respectively.

Then, at time t1, the sense amplifier 4 performs precharging. Thus, the potential of voltage BLCLAMP is set to (VREF_SRC+VPRE+VTN). Voltage VPRE is a precharge voltage provided by the sense amplifier 20. As a result, the potential of the bit line BL is set to a voltage (VREF_SRC+VPRE). The operation of the sense amplifier 4 in this case is as described with reference to FIG. 8. Then, the discharging operation described with reference to FIGS. 9 and 10 is performed. At time t2, the data sensing described with reference to FIG. 11 is performed.

Subsequently, the read is performed on the same data. That is, the bit line is precharged and discharged again. At time t3, the second sensing is performed. As described above, during the second read, the bit line connected to the memory cell transistor MT turned on during the first read is not discharged.

A negative sense scheme cited below refers to a scheme of reading and sensing data by applying the positive voltage VREF_SRC to the source line SL and the p-type well region 32 and applying VCGR=(VREF_SRC−read level) to the selected word line.

<Data Erase Operation>

Figure 13:
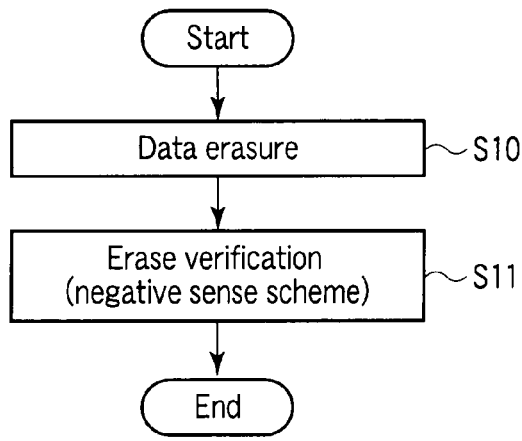
FIG. 13 is a flowchart of an erase sequence in the flash memory according to the first embodiment.

Now, the data erase operation will be described. FIG. 13 is a flowchart showing the flow of operations (hereinafter referred to as an erase sequence) during data erasure according to the present embodiment.

As shown in FIG. 13, in the erase operation, first, data is erased (step S10), and then, erase verification is performed (step S11). The erase verification uses the negative sense scheme. The operations during the erase sequence are controlled by the control circuit 7. In response to instructions from the control circuit 7, the row decoder 3, the sense amplifier 4, the source line driver 5, the well driver 6, the voltage generation circuit 8, and the verify circuit 9 execute processing required for the operations.

First, the data erasure in step S10 will be described. FIG. 14 is a circuit diagram of the memory cell unit 10 during the data erasure. As shown in FIG. 14, the row decoder 3 allows the select gate lines SGD and SGS to float electrically or applies the erase voltage VERA (for example, 20 V) to select the gate lines SGD and SGS. The row decoder 3 further applies 0 V to all the word lines WL0 to WL31. The well driver 6 sets the potential VPW of the p-type well region 32 equal to the erase voltage VERA. As a result, electrons are extracted from the charge accumulation layers 34 in all the memory cell transistors MT0 to MT31. The resulting threshold distribution is as shown in FIG. 15. FIG. 15 is a graph showing the threshold distribution of the memory cell transistor MT. As shown in FIG. 15, the threshold voltages for the memory cell transistors MT0 to MT31 have negative values.

Then, in step S11, the erase verification is performed. The erase verification is a process of determine whether or not the threshold distribution shown in FIG. 15 is at a predetermined threshold level. That is, first, data is read from the memory cell transistor MT from which the data has been erased. Then, the sensing result is provided to the verify circuit 9, which then determines the threshold level.

For example, the erase verification is performed by determining whether or not the threshold voltage of the memory cell transistor MT subjected to the erasure is lower than a predetermined threshold level. The predetermined threshold level is, for example, the read level of the "1" data. If the threshold voltages of all the memory cell transistors MT are lower than the read level of the "1" data, the data has been accurately erased. On the other hand, if the threshold value of any of the memory cell transistors MT is higher than the read level of the "1" data, the data has been insufficiently erased. The threshold level (in the above-described example, the read level of the "1" data) serving as a reference is hereinafter referred to as a verify level Vrfy.

Whether or not the threshold voltage is lower than the verify level is determined by applying a voltage corresponding to the verify level Vrfy to all word lines to perform the read operation and checking whether or not the read operation has turned on all the memory cell transistors MT. That is, when all the memory cell transistors MT are turned on to allow current to flow from the bit line BL to the source line SL, the verify circuit 9 determines that the data has been accurately erased.

Like the data read operation described above, the data read during the erase verification is performed on all the bit lines at a time using the negative sense scheme. That is, the source line driver 5 applies voltage VREF_SRC to the source line SL. The well driver 6 applies voltage VREF_SRC to the well region 32. The row decoder 3 applies voltage (VDD+VREF_SRC) to the select gate lines SGD and SGS. Moreover, since the verify level Vrfy has a negative value, the row decoder 3 applies (VREF_SRC−|Vrfy|) to all the word lines WL. Then, the data is read and sensed by the method described with reference to FIGS. 8 to 11.

FIG. 16 is a timing chart showing variations in the voltages of the various signals observed when the data read operation is performed during the erase verification. FIG. 16 shows a case in which Vrfy=V01 (negative value) and in which |V01|=VREF_SRC, by way of example.

As shown in FIG. 16, at time t0, the row decoder 3 applies voltage VCGR=(VREF_SRC−|V01|)=0 V to all the word lines WL. The sense amplifier 4 sets the potential of the bit line BL to VREF_SRC. The source line driver 5 and the well driver 6 apply voltage VREF_SRC to the source line SL and the well region 32, respectively. Thereafter, at time t1, the sense amplifier 4 performs the precharging. The data read and sensing operation is then performed as described with reference to FIG. 12.

<Effects>

As described above, the NAND flash memory according to the first embodiment of the present invention exerts effects (1) and (2).

(1) The operating speed of the NAND flash memory can be improved.

The NAND flash memory according to the present embodiment reads data by sensing current using the negative sense scheme. Thus, the operating speed of the NAND flash memory can be improved. This effect will be described below in detail.

The conventional NAND flash memory uses a bit line shield scheme to read data during the erase verification. The bit line shield scheme is a sense scheme of sensing a voltage generated in the bit line. In this scheme, only any of all the bit lines is selected, with the unselected bit lines fixed to a given potential. This scheme is used to prevent the adjacent bit lines from affecting each other to vary the mutual potentials. Thus, the data is read onto only one of the two adjacent bit lines. That is, the bit line shield method allows the data to be read onto only half of all the bit lines at a time. To allow the data to be read onto all the bit lines, the read must be performed at least twice.

Moreover, because of the use of a source follower form, the bit line shield scheme needs to wait until the voltage corresponding to the threshold of the memory cell transistor is read onto the selected bit line. This also results in the need for a long time for the data read.

However, to read data, the configuration according to the present embodiment applies voltage VREF_SRC to the source line SL and the p-type well region 32, and applies the VCGR=(VREF_SRC−read level) to the selected word line WL. Thus, the voltage corresponding to the read level is applied to between the gate and source of the memory cell transistor MT. That is, the present embodiment uses the above-described negative sense scheme. Consequently, to read even data with a negative read level (erased state), the sense amplifier 4 senses current instead of voltage to enable the read (see FIGS. 8 to 11). The scheme of sensing current (hereinafter referred to as a current sense scheme) enables the potentials of the bit lines BL to be set to the given value, preventing the adjacent bit lines from affecting each other. The data can thus be read from all the bit lines BL at a time. Therefore, the speed of the erase verify operation can be increased. Moreover, the current sense scheme eliminates the need to wait for a change in voltage based on the source follower form. This also enables an increase in the speed of the erase verify operation. As a result, the operating speed of the NAND flash memory can be improved.

(2) The intervals among the threshold voltage distributions of the memory cell transistor MT can be reduced.

For a negative read level, the configuration according to the present embodiment sets voltage VCGR equal to (VREF_SRC−|read level|). For a positive read level (at least zero), the configuration similarly applies the positive voltage VREF_SRC to the source line to set voltage VCGR equal to (VREF_SRC+|read level|). Thus, data can be read according to the negative sense scheme regardless of the read level (whether the read level is positive or negative).

The conventional current sense scheme sets the potential of the source line SL to 0 V. This is because a positive read level can be applied to VGS of the memory cell transistor MT without the need to provide the positive voltage to the source line SL.

However, when, for example, the negative sense scheme is used for a negative read level (that is, the positive voltage VREF_SRC is applied to the source line SL and the well region 32) and not for a positive read level (that is, 0 V is applied to the source line SL and the well region 32), the read scheme varies depending on the read level. Variation in read scheme results in the need to increase data distribution intervals. For example, in the example in FIG. 3, the interval between the threshold distribution of the "0" data and the threshold distribution of the "1" data needs to be larger than the intervals among the other data. This leads to the need to shift the threshold distributions of the "2" to "7" data to a high voltage side. Shifting the threshold distributions to the high voltage side requires a higher write voltage and a higher read voltage. This increases a load on the voltage generation circuit 8 and the stress of the memory cell transistor MT.

However, the configuration according to the present embodiment reads all the data according to the negative sense scheme. This also applies to the normal data read operation, erase verify operation, and programming verify operation. That is, the negative sense scheme can be uniformly used for all the data reads. Thus, the interval between the "0" data and the "1" data in FIG. 3 can be set equal to those among the other data. As a result, a possible increase in required write and read voltages can be prevented. This enables a reduction in the load on the voltage generation circuit 8 and in the stress of the memory cell transistor MT. Therefore, the operational reliability of the NAND flash memory can be improved.

[Second Embodiment]

Now, a semiconductor memory device and a method of erasing data from the semiconductor memory device according to a second embodiment of the present invention will be described. The present embodiment corresponds to the first embodiment in which soft programming and verification for the soft programming are performed after erase verification. Only differences from the first embodiment will be described below.

<Erase Sequence>

FIG. 17 is a flowchart showing an erase sequence according to the present embodiment. The present sequence is executed under the control of the control circuit 7. As shown in FIG. 17, the processing in steps S10 and S11 is executed as in the case of the first embodiment.

After step S1, a control circuit 7 executes the soft programming (step S20). The soft programming will be described with reference to FIG. 18. FIG. 18 is a graph showing the threshold distribution of a memory cell transistor MT. The soft programming is an operation of programming the memory cell transistor MT immediately after the erasure. This changes the threshold voltage in a positive direction to reduce the threshold distribution range for the erased state as shown in FIG. 18.

Then, soft programming verification is performed (step S21). The soft programming verification is a process of determining whether or not the threshold voltage of the memory cell transistor MT is within a predetermined voltage range after the soft programming. The details of the soft programming verification are the same as those of the erase verification described in the first embodiment. The soft programming verification corresponds to the current sense scheme which uses the negative sense scheme and to which a required verify level Vrfy is applied.

In the soft programming verification, if the control circuit 7 does not determine that the threshold voltages of all the memory cell transistors MT are within the predetermined voltage range (step S22, NO), step S20 is repeated. On the other hand, if the threshold voltages of all the memory cell transistors MT are within the predetermined voltage range (step S22, YES), the erase sequence is completed.

<Soft Programming>

Now, the soft programming in step S20 in FIG. 17 will be described below in detail. Two types of methods are applicable to the soft programming according to the present embodiment. First, the first method will be described with reference to FIG. 19. FIG. 19 is a circuit diagram of a memory cell unit 10 during the soft programming.

As shown in FIG. 19, a row decoder 3 applies a voltage VSGD that allows a select transistor ST1 to be turned on, to a select gate line SGD. The row decoder 3 thus selects all word lines WL, and applies a voltage VSPGM to the selected word lines WL0 to WL31. Voltage VSPGM is required to inject electrons into a charge accumulation layer 34 by FN tunneling. As a result, the potential of the bit line BL is transmitted to the channels of the memory cell transistors MT0 to MT31 via the channel of the select transistor ST1. Thus, electrons are injected into the charge accumulation layers 34 in the memory cell transistors MT0 to MT31 to increase the threshold voltages in the positive direction. That is, the present method selects all the word lines WL included in the same memory cell unit 10 to program all the memory cell transistors MT at a time.

Figure 20:
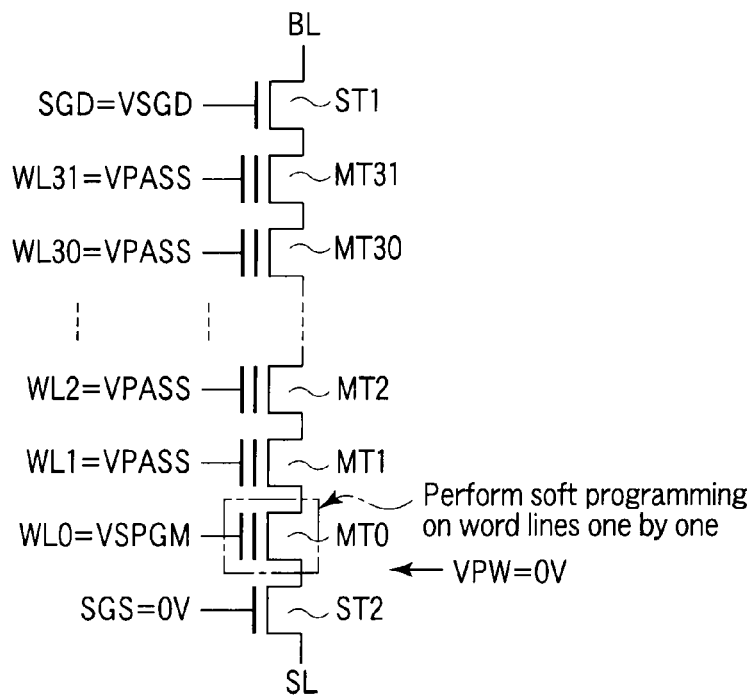

Now, another method will be described with reference to FIG. 20. FIG. 20 is a circuit diagram of the memory cell unit 10 during the soft programming. The present method differs from the method in FIG. 19 in that the present method is intended for only one selected word line WL and programs the word lines one by one. FIG. 20 shows that the word line WL0 is selected, by way of example.

As shown in FIG. 20, the row decoder 3 applies voltage VSGD to the select gate line SGD. The row decoder 3 thus selects the word line WL0, and applies voltage VSPGM to the selected word line WL0. The row decoder 3 further applies a voltage VPASS to the unselected word lines WL1 to WL31. Voltage VPASS turns on the memory cell transistors MT connected to the unselected word lines WL1 to WL31. As a result, the potential of the bit line BL is transmitted to the channel of memory cell transistor MT0 via the channel of the select transistor ST1 and the channels of memory cell transistors MT1 to MT31. Thus, electrons are injected into the charge accumulation layer 34 in memory cell transistor MT0 to increase the threshold voltage in the positive direction. This operation is sequentially performed on the word lines WL1 to WL31.

In the soft programming, 0 V is applied to the select gate line SGS to turn off a select transistor ST2. Furthermore, the source line driver 5 and the well driver 6 apply 0 V to the source line SL and the well region 32, respectively.

<Effects>

As described above, the NAND flash memory according to the second embodiment of the present invention exerts not only the effects (1) and (2) described in the first embodiment but also an effect (3).

(3) Possible variation in the threshold voltage of the memory cell transistor MT can be inhibited.

The NAND flash memory according to the present embodiment performs the soft programming and the soft programming verification after the erase verification. This enables a reduction in the distribution range of the threshold voltage of the memory cell transistor MT in the erased state. Furthermore, the distribution as a whole can be shifted in the positive direction compared to that obtained immediately after the erasure. Thus, the adverse effect of the coupling between the adjacent floating gates 34 can be inhibited.

That is, the coupling between the floating gates 34 affects a change in threshold during the programming operation. This adverse effect depends on the voltage shift between the threshold distributions. However, the configuration according to the present embodiment reduces the distribution range and shifts the distribution in the positive direction compared to that obtained immediately after the erasure. Thus, the configuration reduces the adverse effect.

In particular, the adverse effect of the coupling becomes more significant as the generation of design rules progresses. Thus, the reduction of the adverse effect based on the soft programming is particularly effective for increasingly miniaturized semiconductor memories.

(4) Boost efficiency can be improved.

In the NAND flash memory, during the data write operation, the injection of electrons into the charge accumulation layer may be avoided to prevent a change in threshold voltage (in other words, the electron injection is limited to the degree at which held data is prevented from shifting to another level). This is hereinafter referred to as "1" programming. In this connection, a technique is known which brings the memory cell unit 10 including the memory cell transistor to be "1" programmed, into the electrically floating state so that coupling with the word line WL raises the potential of channel of the memory cell transistor, thus reducing the potential difference between the control gate and the channel. This technique is hereinafter referred to as a self boost scheme. On the other hand, the technique in which the electrons are injected into the charge accumulation layer to change the threshold level is hereinafter referred to as "0" programming.

The self boost scheme needs to sufficiently raise (boost) the potential of the channel by coupling. A decrease in boost efficiency prevents the potential of the channel from rising sufficiently. As a result, the memory cell transistor MT to be "1" programmed may be "0" programmed.

Thus, the self boost scheme involves a technique of using only the memory cell transistor MT in the erased state for self boosting. In this case, voltage VPASS is applied to the word lines WL closer to the select gate line SGD than the selected word line WL to turn on the memory cell transistors MT connected to these word lines WL. On the other hand, a voltage of a low level (for example, 0 V) is applied to any of the word lines WL closer to the select gate line SGS than the selected word line WL to cut off the memory cell transistor MT connected to this word line. Then, the channel of the selected memory cell transistor MT is electrically separated from the memory cell transistors MT in which data has already been programmed. The boost efficiency can thus be improved.

However, if the memory cell transistor MT provided with the low-level voltage is in the erased state ("1" programmed state) and the threshold voltage of the memory cell transistor MT is sufficiently low, the memory cell transistor MT may fail to be cut off. Then, the boost efficiency decreases, possibly causing a miswrite.

However, the configuration according to the present embodiment performs the soft programming to shift the distribution of the threshold voltage for the erased state to the high voltage side. Thus, the memory cell transistor MT can be cut off during the self boosting. Consequently, the boost efficiency can be increased, thus improving the reliability of the write operation.

[Third Embodiment]

Now, a semiconductor memory device and a method of erasing data from the semiconductor memory device according to a third embodiment of the present invention will be described. The present embodiment corresponds to the first embodiment in which soft programming is performed by a method different from that according to the second embodiment. Only differences from the first and second embodiments will be described below.

<Erase Sequence>

An erase sequence according to the present embodiment is similar to that shown in FIG. 17 and described in the second embodiment. Steps S10, S11, and S21 in the third embodiment are similar to those in the second embodiment and will thus not be described below. Only the soft programming in step S20 will be described below.

Figure 21:
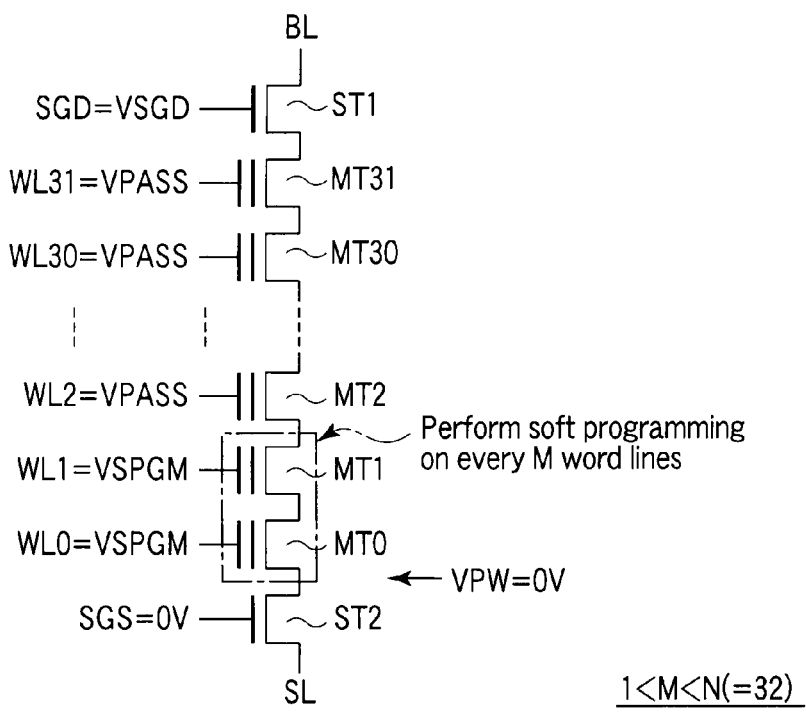
FIG. 21 is a circuit diagram of a memory cell unit according to a third embodiment.

The soft programming according to the present embodiment programs a plurality of the word lines WL at a time. In this case, when the number of the word lines WL included in the same memory unit 10 is defined as N (in the first to third embodiments, N=32), the number M of simultaneously selected word lines WL is such that $1<M<N$. That is, the number M is smaller than the total number of word lines and is at least two. The simultaneously selected word lines WL are located adjacent to each other. FIG. 21 is a circuit diagram of a memory cell unit 10 during the soft programming. FIG. 21 shows, by way of example, that two word lines are simultaneously selected (M=2) and that the word lines WL0 and WL1 are selected.

As shown in FIG. 21, a row decoder 3 applies a voltage VSGD to a select gate line SGD, and applies a voltage VSPGM to selected word lines WL0 and WL1. The row decoder 3 further applies a voltage VPASS to the unselected word lines WL2 to WL31. Then, memory cell transistors MT0 and MT1 are programmed at a time. For M=2 and N=32, the operation shown in FIG. 21 is performed 16 times to program all the word lines WL0 to WL32. That is, first, the word lines WL0 and WL1 are programmed, and then the word lines WL2 and WL3 are programmed. Then, the word lines WL4 and WL5 are programmed, and the remaining word lines are sequentially programmed up to the word lines WL30 and WL31.

<Effects>

As described above, the NAND flash memory according to the third embodiment of the present invention exerts not only the effects (1) to (4) described in the first and second embodiments but also an effect (5).

(5) The speed of the soft programming can be increased, while the threshold distribution range for the erased state can be reduced (1).

The configuration according to the present embodiment programs the M ($1<M<N$) word lines at a time during the soft programming after the erase operation. The programming is sequentially performed on every M word lines. Thus, compared to the case in which the word lines are programmed one by one, the present embodiment enables an increase in the speed of the soft programming. Furthermore, compared to the case in which all the word lines are subjected to the soft programming at a time, the present embodiment enables the threshold distribution to be accurately set. That is, the threshold distribution range can be reduced. Therefore, the increased speed of the soft programming and the increased accuracy of the threshold distribution can both be achieved.

Obviously, increasing the number M of word lines to be subjected to the soft programming at a time enables an increase in operating speed. Reducing the number M of word lines to be subjected to the soft programming at a time enables an increase in distribution accuracy. Therefore, the number M of word lines can be appropriately selected according to performance required for the product.

[Fourth Embodiment]

Now, a semiconductor memory device and a method of erasing data from the semiconductor memory device according to a fourth embodiment of the present invention will be described. The present embodiment corresponds to the second or third embodiment in which soft programming is performed in two steps. Only differences from the second and third embodiments will be described below.

<Erase Sequence>

Figure 22:
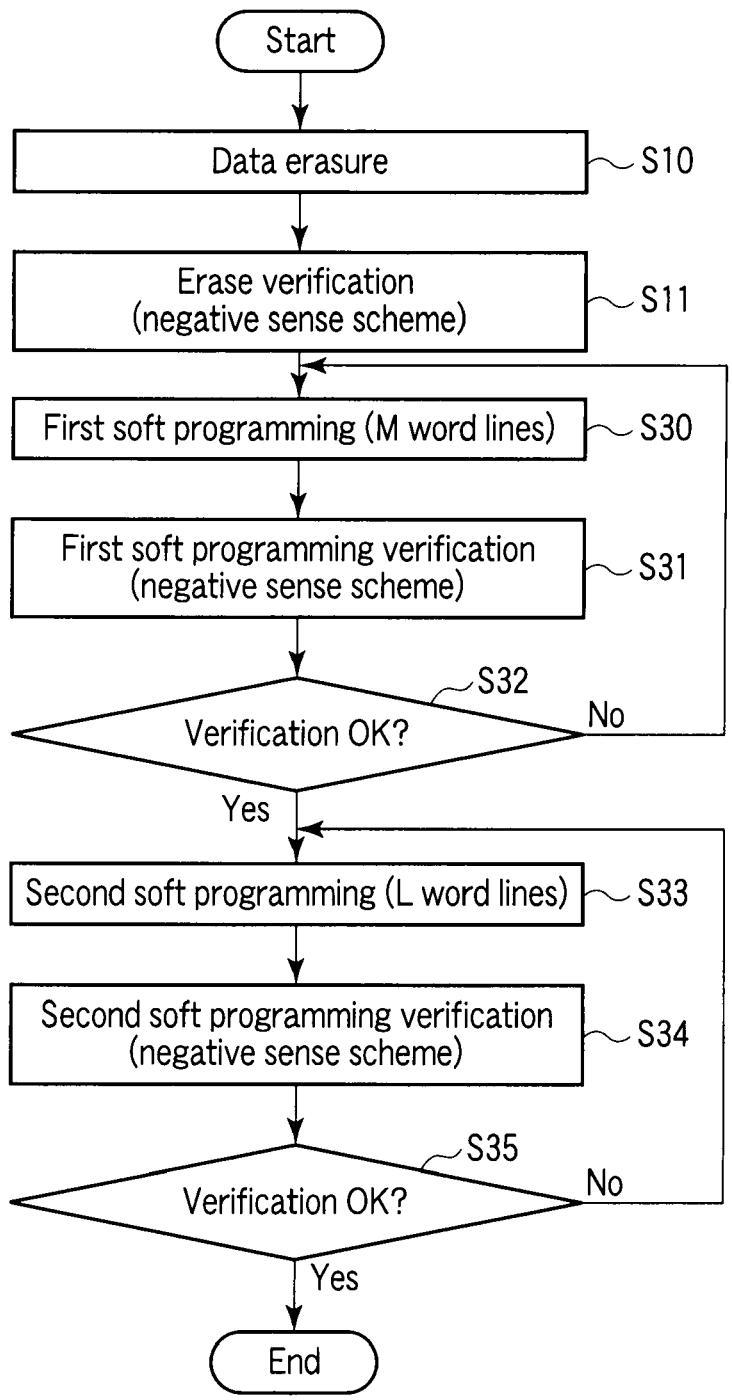
FIG. 22 is a flowchart showing an erase sequence in a flash memory according to a fourth embodiment of the present invention.

FIG. 22 is a flowchart showing an erase sequence according to the present embodiment. The present sequence is executed under the control of the control circuit 7. As shown in FIG. 22, the processing in steps S10 and S11 is executed as in the case of the first embodiment.

After step S11, the control circuit 7 executes first soft programming (step S30). Like the soft programming in step S20 described above in the third embodiment, the first soft programming programs a plurality of (M) the word lines at a time. The number M of the word lines selected at a time may be equal to the total number N of word lines. That is, for M=N, the operation is similar to that shown in FIG. 19 and described in the second embodiment. For M<N, the operation is similar to that described in the third embodiment.

After step S30, the first soft programming verification is performed (step S31). The first soft programming verification is a process of determining whether or not the threshold voltage of the memory cell transistor MT is within a predetermined voltage range after the first soft programming. The details of the first soft programming verification are the same as those of the erase verification described in the first embodiment. The first soft programming verification corresponds to the current sense scheme which uses the negative sense scheme and to which a required verify level Vrfy is applied.

In the first soft programming verification, if a control circuit 7 does not determine that the threshold voltages of all the memory cell transistors MT are within the predetermined voltage range (step S32, NO), step S30 is repeated. On the other hand, if the threshold voltages of all the memory cell transistors MT are within the predetermined voltage range (step S32, YES), second soft programming is performed (step S33).

The basic operation of the second soft programming is the same as that of the first soft programming. However, the number L of word lines selected at a time is smaller than that M in the first soft programming. That is, $L<M\leq N$. For L=1, the operation is similar to that shown in FIG. 20 and described in the second embodiment. For L>2, the operation is similar to that described in the third embodiment.

After step S33, the control circuit 7 performs the second soft programming verification (step S34). The second soft programming verification is a process of determining whether or not the threshold voltage of the memory cell transistor MT is within a predetermined voltage range after the second soft programming. The details of the second soft programming verification are the same as those of the erase verification described in the first embodiment. The second soft programming verification corresponds to the current sense scheme which uses the negative sense scheme and to which the required verify level Vrfy is applied.

In the second soft programming verification, if the control circuit 7 does not determine that the threshold voltages of all the memory cell transistors MT are within the predetermined voltage range (step S35, NO), step S33 is repeated. On the other hand, if the threshold voltages of all the memory cell transistors MT are within the predetermined voltage range (step S35, YES), the erase sequence is completed.

<Change in Threshold Distribution>

Figure 23:
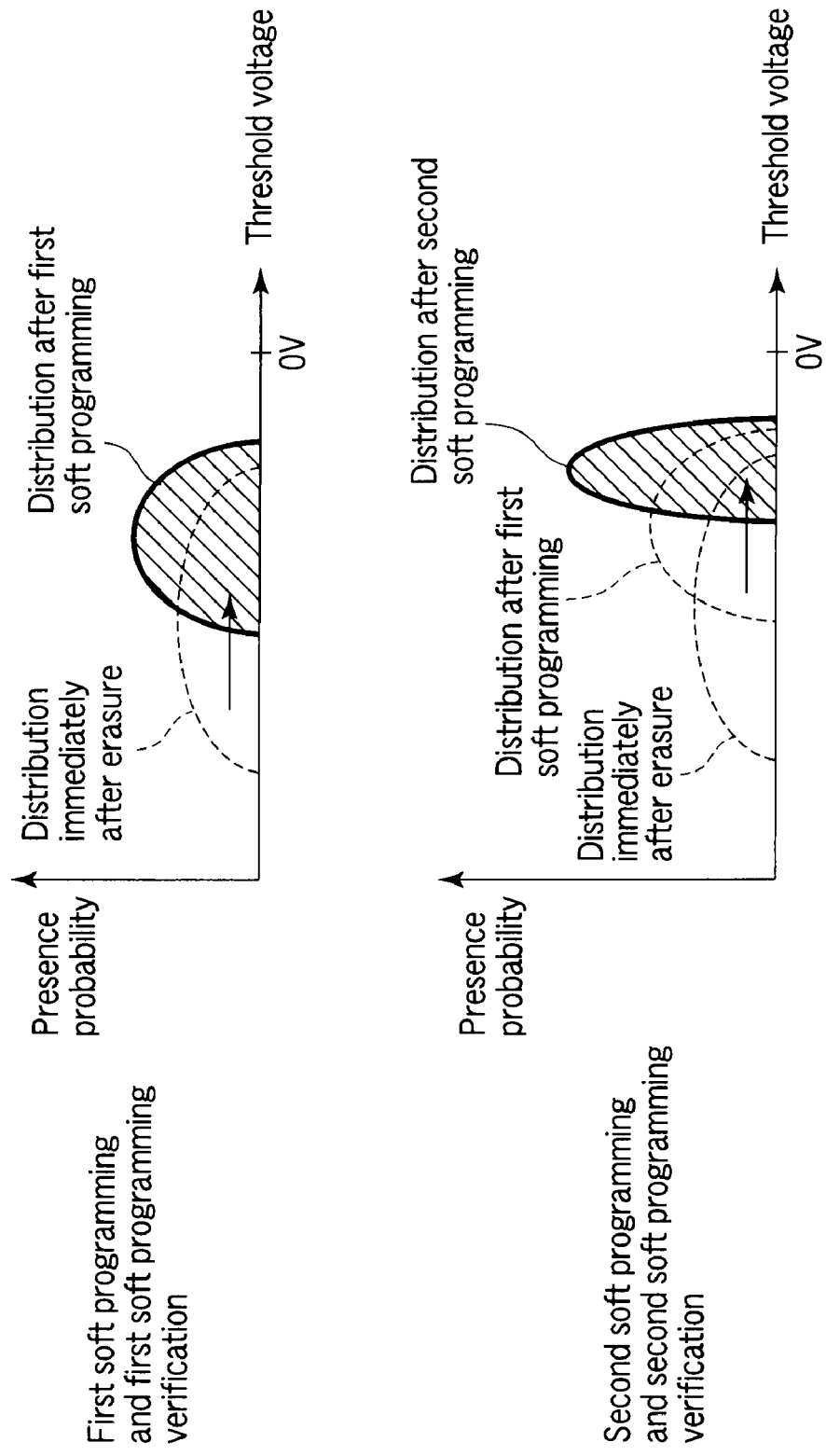
FIG. 23 is a graph showing the threshold distribution of a memory cell according to a fourth embodiment of the present invention.

Now, a change in the threshold distribution of the memory cell transistor MT resulting from the erase sequence will be described with reference to FIG. 23. FIG. 23 is a graph showing a change in threshold distribution resulting from the first soft programming and first soft programming verification in steps S30 and S31, and a change in threshold distribution resulting from the second soft programming and second soft programming verification in steps S33 and S34. Shaded areas in FIG. 23 show threshold distributions obtained after the respective operations.

As shown in FIG. 23, first, the first soft programming and the first soft programming verification shift the entire threshold distribution obtained immediately after the erasure, in the positive direction. In particular, the lower limit of the threshold distribution is shifted to the high voltage side, reducing the threshold distribution range compared to that obtained immediately after the erasure. Thereafter, the second soft programming and the second soft programming verification are performed to shift the threshold distribution as a whole further in the positive direction. As a result, the distribution range of the threshold voltage of the memory cell transistor MT in the erased state is significantly reduced compared to that obtained immediately after the erasure.

<Effects>

As described above, the NAND flash memory according to the fourth embodiment of the present invention exerts not only the effects (1) to (5) described in the first to third embodiments but also an effect (6).

(6) The speed of the soft programming can be increased, while the threshold distribution range for the erased state can be reduced (2).

The configuration according to the present embodiment performs the soft programming in two steps after the erase operation. That is, the programming is performed first on every M (L<M≦N) word lines and then on every L word lines at a time.

That is, the large number of word lines WL are first programmed, enabling an increase in the speed of the soft programming. Moreover, the next soft programming programs the smaller number of word lines WL at a time, allowing the threshold distribution to be accurately set. That is, the threshold distribution range for the erased state can be reduced. Therefore, the increased speed of the soft programming and the increased accuracy of the threshold distribution can both be achieved.

As is the case with the fourth embodiment, increasing the numbers M and L of word lines enables an increase in operating speed. Reducing the number M of word lines enables an increase in distribution accuracy. Possible combinations of the numbers W and L of word lines WL are as follows.

M=N (collective programming of all the word lines), L=1 (one-by-one programming)

M=N (collective programming of all the word lines), L=plural number (collective programming of a plurality of word lines)

M=plural number (M<N, collective programming of a plurality of word lines), L=1 (one-by-one programming)

M=plural number (M<N, collective programming of a plurality of word lines), L=plural number (collective programming of a plurality of word lines)

In these cases, M>L as described above.

[Fifth Embodiment]

Now, a semiconductor memory device and a method of erasing data from the semiconductor memory device according to a fifth embodiment of the present invention will be described. The present embodiment corresponds to the first to fourth embodiments in which a sense amplifier 4 is based on a bit line shield scheme of sensing current to which the negative sense scheme is applied. Thus, the present embodiment is the same as the first to fourth embodiments except for the configuration and operation of the sense amplifier 4. Only these differences will be described below.

<Sense Amplifier>

The sense amplifier 4 according to the present embodiment will be described with reference to FIG. 24. FIG. 24 is a circuit diagram of the sense amplifier 4 and a memory cell array 2 according to the present embodiment.

As shown in FIG. 24, roughly speaking, the sense amplifier 4 includes MOS transistors 54 and 55 described with reference to FIG. 4, and an inverter 60. The inverter 60 inverts and amplifies the potential of the connection node between MOS transistors 54 and 55 to output the resulting potential as read data. That is, the sense amplifier 4 senses a voltage appearing on the bit line BL as a result of a data read. That is, if as a result of the data read, the potential of the bit line BL decreases below the inverted threshold of the inverter 60, the inverter 60 outputs a high level ("1" data). If the potential increases above the inverted threshold, the inverter 60 outputs a low level ("0" data).

Now, still referring to FIG. 24, the operation of reading data using the sense amplifier 4 will be described. For the bit line shield scheme of sensing current, variation in the potential of the bit line BL during sensing is not preferable. Thus, only one of two adjacent bit lines is connected to the sense amplifier 4 through a column selector (not shown in the drawings). The bit line connected to the sense amplifier 4 is hereinafter referred to as a selected bit line. The bit line not connected to the sense amplifier 4 is hereinafter referred to as an unselected bit line.

FIG. 24 shows, by way of example, that the memory cell array 2 includes four bit lines BL and that even-numbered bit lines BL0 and BL2 are selected, while odd-numbered bit lines BL1 and BL3 are unselected. As shown in FIG. 24, the selected bit lines BL0 and BL2 are connected to a MOS transistor 55 in the sense amplifier 4. On the other hand, the unselected bit lines BL1 and BL3 are fixed to a given potential by the column selector (not shown in the drawings) or the sense amplifier 4.

A source line driver 5 and a well driver 6 apply a voltage VREF_SRC to a source line SL and a well region 32. The fixed potential of the unselected bit lines BL1 and BL3 is also set to VREF_SRC. MOS transistor 54 in the sense amplifier 4 precharges the selected bit lines BL0 and BL2 to a level (VPRE+VREF_SRC). Thereafter, a row decoder 3 performs a selecting operation on select gate lines SGD and SGS and word lines WL to read data onto the selected bit lines BL0 and BL2.

The voltages of the bit line BL, a signal BLCLAMP, the source line SL, the p-type well region 32, and the word line WL will be described with reference to FIG. 25. FIG. 25 is a timing chart showing variations in the voltages of the various signals during a read.

As shown in FIG. 25, at time t0, the read operation is started. At time t0, for the data read operation, the row decoder 3 applies a voltage VCGR to the selected word line WL and applies a voltage VREAD to the unselected word line WL. Voltage VCGR has any of the values described with reference to FIG. 7. On the other hand, for the erase verification and the soft programming verification, the row decoder 3 applies a value (in FIG. 25, 0 V) corresponding to the verify level Vrfy to the selected word line WL.

A bit line driver (not shown in the drawings) generates a voltage (VREF_SRC+VTN) as signal BLCLAMP. As a result, MOS transistor 55 is turned on. Thus, the selected bit lines BL0 and BL2 are electrically connected to MOS transistor 54. The sense amplifier 4 sets the potential of the selected bit line BL equal to VREF_SRC. The potential of the unselected bit lines BL1 and BL3 is also fixed to VREF_SRC. The source line driver 5 and the well driver 6 apply voltage VREF_SRC to the source line SL and the well region 32, respectively.

Then, at time t1, the sense amplifier 4 performs precharging. To achieve this, the potential of voltage BLCLAMP is set to (VREF_SRC+VPRE+VTN). As a result, the potential of the selected bit lines BL0 and BL2 is set to a voltage (VREF_SRC+VPRE). On the other hand, the potential of the unselected bit lines BL1 and BL3 is maintained constant at VREF_SRC.

Thereafter, the row decoder 3 applies such a voltage as shown in FIG. 5 to the select gate lines SGD and SGS. Then, when the memory cell transistor MT is turned on, a cell current Icell flows from the selected bit line to the source line. The potential of the selected bit line is set to about VREF_SRC. On the other hand, when the memory cell transistor MT is off, no cell current Icell flows and the potential of the selected bit line is maintained at (VREF_SRC+VPRE). The inverter 60 inverts and amplifies this potential change to output the corresponding signal as read data (time t3).

<Effects>

As described above, the negative sense schemes described in the first to fourth embodiments is applicable to the sense amplifier based on the bit line shield scheme. The negative sense scheme allows the sense amplifier based on the bit line shield scheme to read data of a negative read level. Therefore, the effects (2) to (6) can be exerted by using the sense amplifier based on the bit line shield scheme adopting the negative sense scheme, for the NAND flash memory according to the first to fourth embodiments.

[Sixth Embodiment]

Now, a semiconductor memory device and a method of erasing data from the semiconductor memory device according to a sixth embodiment of the present invention will be described. The present embodiment relates to the details of the first soft programming verification and second soft programming verification according to the above-described fourth embodiment. Only differences from the fourth embodiment will be described below.

<Erase Sequence>

Figure 26:
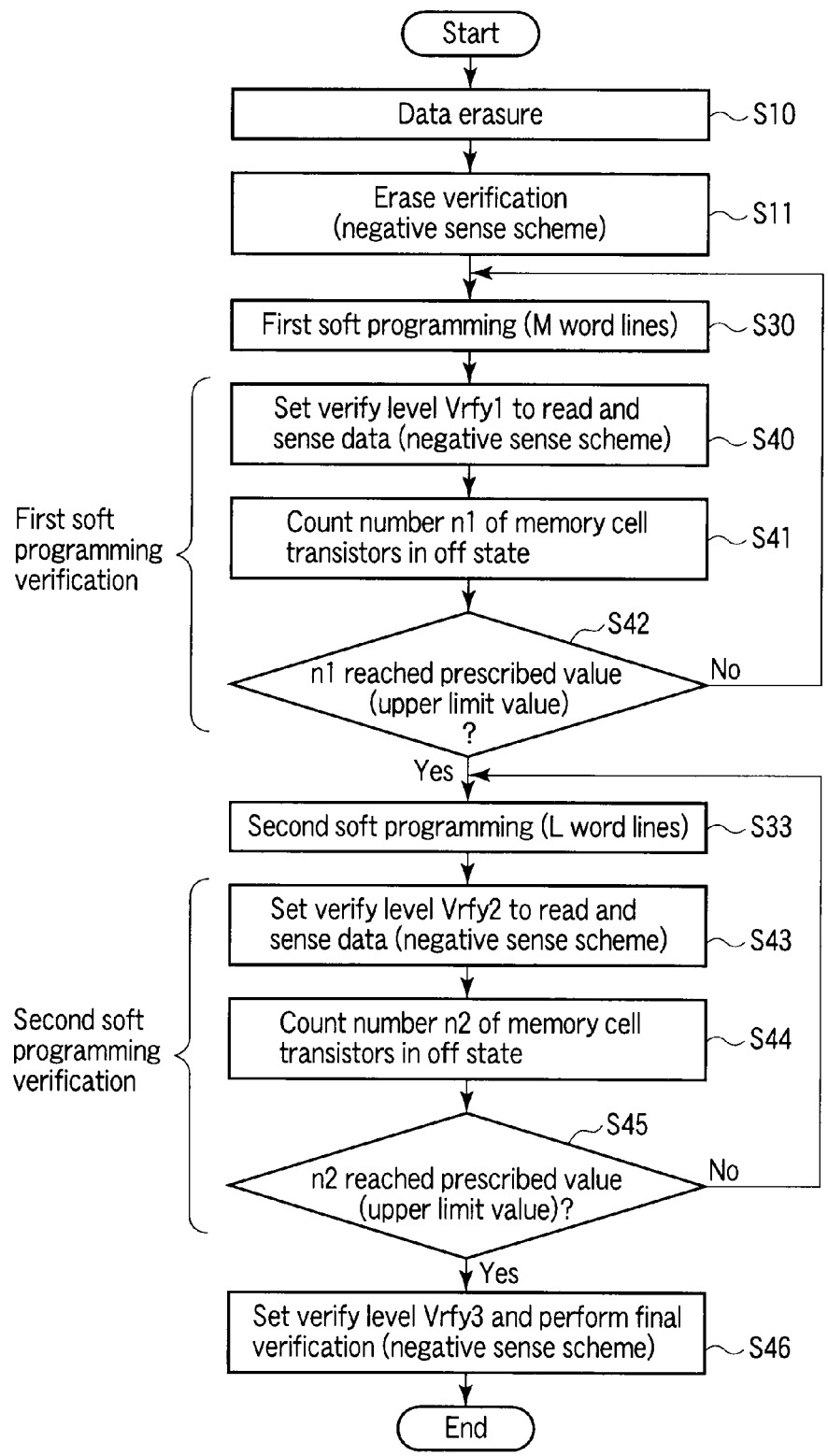
FIG. 26 is a flowchart of an erase sequence in a flash memory according to a sixth embodiment.

FIG. 26 is a flowchart showing an erase sequence according to the present embodiment. FIG. 27 is a graph showing threshold distributions along an erase sequence.

As shown in FIG. 26, first, the processing in steps S10 and S11 is executed to erase data. The threshold distribution of the memory cell transistor MT obtained at this point in time is a graph shown at "step S10" in FIG. 27.

Now, the first soft programming in step S30 described in the fourth embodiment is performed. That is, the soft programming is performed on every M word lines at a time. Thereafter, the first soft programming verification corresponding to step S31 described in the fourth embodiment is performed. That is, first, a verify level Vrfy1 (<0 V) is set and data is read and sensed (step S40). The read is performed according to the above-described negative sense scheme. Thus, a row decoder 3 applies VCGR=(VREF_SRC−|Vrfy1|) to a selected word line WL. A sense amplifier 4 may be based on the current sense scheme or the bit line shield scheme. A verify circuit 9 counts the number n1 of memory cell transistors MT that are off during the read in step S40 (step S41). Steps S30, S40, and S41 are repeated until the number n1 of memory cell transistors MT in the off state reaches a prescribed value.

The threshold distribution of the memory cell transistor MT obtained at this point in time is a graph shown at "steps S30, S40, and S41" in FIG. 27. As shown in FIG. 27, the first soft programming shifts the threshold distribution to the positive voltage side compared to that obtained immediate after the erasure. The first soft programming also reduces the distribution range.

For example, given verify level Vrfy1=−1.2 V, once the number n1 of memory cell transistors MT with a threshold located in the shaded region in the figure reaches the prescribed value, the first soft programming and the first soft programming verification are completed (step S42, YES). That is, the prescribed value in step S42 is the upper limit value of the number of the memory cell transistors allowed to exceed verify level Vrfy1 during the first soft programming. Verify level Vrfy1 is the approximate upper limit value of the threshold voltage to be set by the first soft programming.

Then, the second soft programming in step S33 described in the fourth embodiment is performed. That is, the soft programming is performed on every L word lines at a time. Thereafter, the second soft programming verification corresponding to step S34 described in the fourth embodiment is performed. That is, a verify level Vrfy2 (<0 V, |Vrfy2|<|Vrfy1|) is set and data is read and sensed (step S43). The read is also performed according to the negative sense scheme. Thus, the row decoder 3 applies VCGR=(VREF_SRC−|Vrfy2|) to the selected word line WL. The verify circuit 9 counts the number n2 of memory cell transistors MT in the off state (step S44). Steps S33, S43, and S44 are repeated until the number n2 of memory cell transistors MT in the off state reaches a prescribed value.

The threshold distribution of the memory cell transistor MT obtained at this point in time is a graph shown at "steps S33, S43, and S44" in FIG. 27. As shown in FIG. 27, the second soft programming shifts the threshold distribution further to the positive voltage side compared to that obtained immediate after the first soft programming verification. The second soft programming also reduces the distribution range.

For example, given verify level Vrfy2=−1.0 V, once the number n2 of memory cell transistors MT with a threshold located in the shaded region in the figure reaches the prescribed value, the second soft programming and the second soft programming verification are completed (step S45, YES). That is, the prescribed value in step S45 is the upper limit value of the number of the memory cell transistors allowed to exceed verify level Vrfy2 during the second soft programming. Verify level Vrfy2 is the approximate upper limit value of the threshold voltage to be set by the second soft programming.

Finally, final verification is performed (step S46). The final verification is a process of determining whether or not the upper limit of the threshold distribution set by the process up to step S45 is less than the prescribed value (Vrfy2). This is shown by a graph shown at "step S46" in FIG. 27.

That is, a verify level Vrfy3 (<0 V, |Vrfy3|<|Vrfy2|) is set and data is read and sensed. The read is also performed according to the negative sense scheme. Thus, the row decoder 3 applies VCGR=(VREF_SRC−|Vrfy3|) to the selected word line WL. When all the memory cell transistors MT are turned on, the erase sequence is completed.

When the soft programming is performed in two steps as is the case with the fourth embodiment, the verify level may be varied between the steps as described in the present embodiment.

[Seventh Embodiment]

Now, a semiconductor memory device and a method of erasing data from the semiconductor memory device according to a seventh embodiment of the present invention will be described. The present embodiment uses verify levels Vrfy1 and Vrfy2 according to the sixth embodiment to specify the lower limit of the threshold distribution instead of the upper limit of the threshold distribution. Only differences from the fourth embodiment will be described below.

<Erase Sequence>

Figure 28:
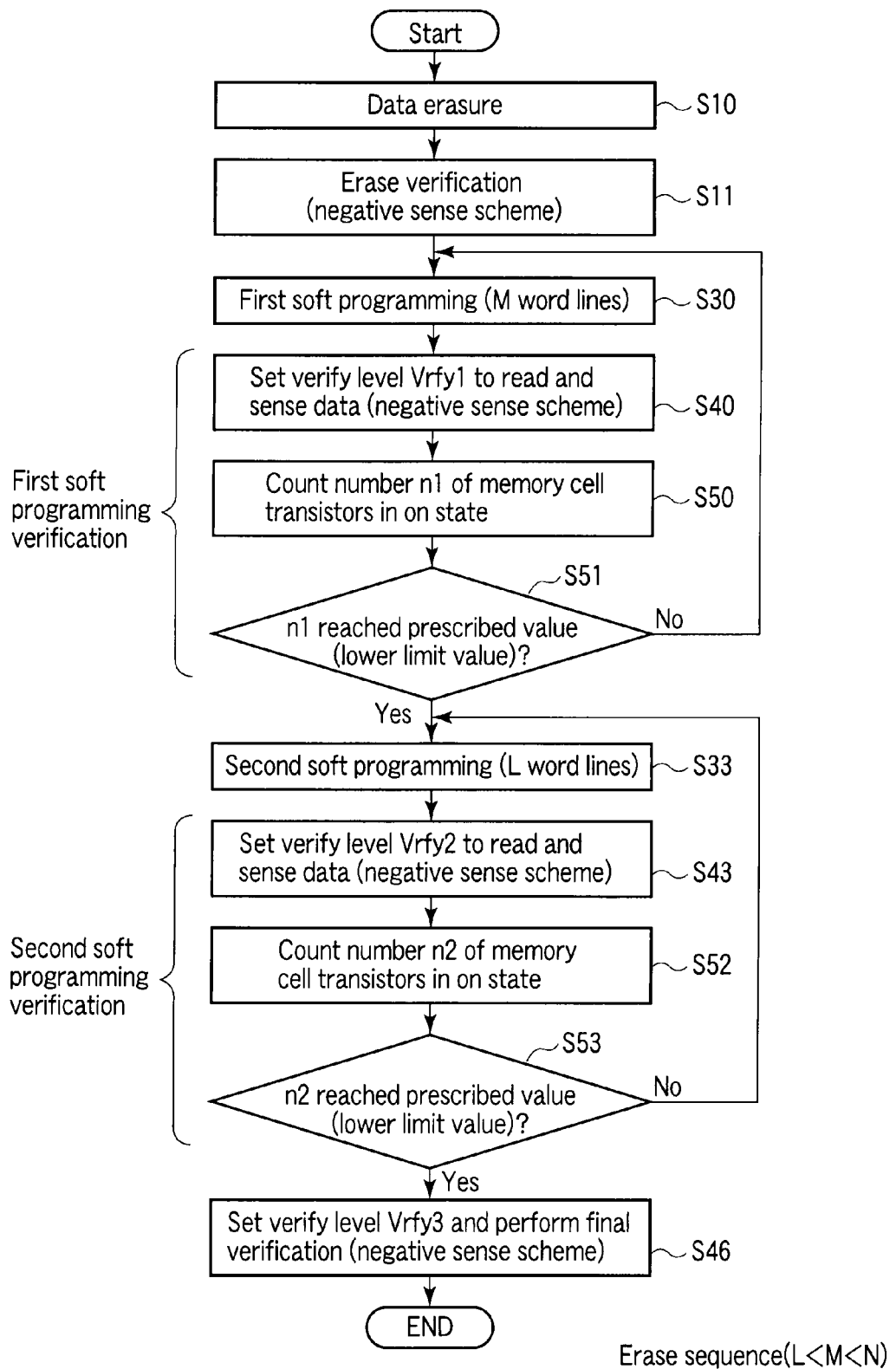
FIG. 28 is a flowchart of an erase sequence in a flash memory according to a seventh embodiment.

FIG. 28 is a flowchart showing an erase sequence according to the present embodiment. FIG. 29 is a graph showing threshold distributions along an erase sequence.

First, as is the case with the sixth embodiment, the processing in steps S10, S11, and S30 is executed, and then first soft programming verification is performed. That is, first, a verify level Vrfy1 (<0 V) is set and data is read and sensed (step S40). However, unlike in the case of the sixth embodiment, verify level Vrfy1 according to the present embodiment is the approximate lower limit value of the threshold voltage to be set by the first soft programming verification as shown in FIG. 29. For example, Vrfy=−1.6 V. A verify circuit 9 counts the number n1 of memory cell transistors MT that are on during the read in step S40 (step S50). Steps S30, S40, and S50 are repeated until the number n1 of memory cell transistors MT in the on state reaches a prescribed value. That is, the prescribed value in step S50 is the lower limit value of the number of memory cell transistors with a threshold voltage equal to or lower than verify level Vrfy1 during the first soft programming.

Then, second soft programming is performed, and then second soft programming verification is performed. That is, first, verify level Vrfy2 (<0 V) is set and data is read and sensed (step S43). However, unlike in the case of the sixth embodiment, verify level Vrfy2 according to the present embodiment is the approximate lower limit value of the threshold voltage to be set by the second soft programming verification as shown in FIG. 29. For example, Vrfy=−1.4 V. The verify circuit 9 counts the number n2 of memory cell transistors MT that are on during the read in step S43 (step S52). Steps S33, S43, and S52 are repeated until the number n2 of memory cell transistors MT in the on state reaches a prescribed value. That is, the prescribed value in step S53 is the lower limit value of the number of memory cell transistors with a threshold voltage equal to or lower than verify level Vrfy2 during the second soft programming.

Thereafter, in step S46, final verification is performed to complete the erase sequence.

As described above, verify levels Vrfy 1 and Vrfy2 in the first and second soft programming verifications may specify the lower limit of the threshold distribution.

As described above, to read data, the semiconductor memory device according to each of the first to seventh embodiments of the present invention applies voltage VREF_SRC to the source line SL and the p-type well region 32, and applies the VCGR=(VREF_SRC−read level) to the selected word line WL. The semiconductor memory device thus applies the voltage corresponding to the read level to between the gate and source of the memory cell transistor MT. The present technique is uniformly used for all the data reads performed in the NAND flash memory. As a result, the intervals among the threshold distributions of the memory cell transistor can be reduced. Moreover, the semiconductor memory device uses the sense amplifier based on the current sense scheme to allow data to be read from all the bit lines at a time. Thus, the operating speed of the NAND flash memory can be improved.

Moreover, after the data erasure, the soft programming is performed on a plurality of the word lines WL (the number of the word lines WL is smaller than the total number of word lines) at a time. Thus, the threshold distribution range of the memory cell transistor in the erased state can be reduced without an increase in time required for the erase sequence.

In the examples described in the third and fourth embodiments, the data read is performed according to the negative sense scheme. However, these embodiments may utilize the conventional read method not using the negative sense scheme. In this case, the effects (3) to (6) can be exerted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell formed on a well region in a semiconductor substrate and having a stacked gate including a charge accumulation layer and a control gate, the memory cell being configured to hold data of at least two levels;
   a bit line electrically connected to a drain of the memory cell and transferring data;
   a source line electrically connected to a source of the memory cell; and
   a sense amplifier which, during erase verification to determine whether or not a threshold voltage of the memory cell in an erased state is at a threshold level, reads the data from the memory cell and senses the data with a first voltage applied to the control gate of the memory cell, with a positive second voltage higher than the first voltage applied to the well region and the source line, and with a third voltage higher than the second voltage applied to the bit line.

2. The device according to claim 1, wherein the sense amplifier senses a current in the bit line to determine whether the data read from the memory cell is "1" or "0".

3. The device according to claim 1, wherein the first voltage is zero or has a positive value.

4. The device according to claim 1, wherein the memory cell is configured to hold data of at least four levels, and threshold levels corresponding to at least two of the four levels have negative values.

* * * * *